United States Patent
Park et al.

(10) Patent No.: US 12,389,760 B2
(45) Date of Patent: Aug. 12, 2025

(54) DISPLAY DEVICE INCLUDING A PROTRUDING SUPPORT

(71) Applicant: SAMSUNG DISPLAY CO., LTD., Yongin-si (KR)

(72) Inventors: Junhyun Park, Yongin-si (KR); Ansu Lee, Yongin-si (KR); Dongwoo Kim, Yongin-si (KR); Sungjae Moon, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/544,577

(22) Filed: Dec. 19, 2023

(65) Prior Publication Data

US 2024/0147797 A1    May 2, 2024

Related U.S. Application Data

(63) Continuation of application No. 17/567,254, filed on Jan. 3, 2022, now Pat. No. 11,882,738, which is a
(Continued)

(30) Foreign Application Priority Data

Dec. 13, 2018    (KR) ........................ 10-2018-0161182

(51) Int. Cl.
*H10K 59/124* (2023.01)
*H10K 50/842* (2023.01)
(Continued)

(52) U.S. Cl.
CPC ....... *H10K 59/124* (2023.02); *H10K 50/8426* (2023.02); *H10K 50/844* (2023.02);
(Continued)

(58) Field of Classification Search
CPC .... H10K 59/131; H10K 59/38; H10K 50/844; H10K 50/8426
See application file for complete search history.

(56) References Cited

U.S. PATENT DOCUMENTS 9,356,085 B2   5/2016 Kim
9,954,200 B2   4/2018 Kim et al.
(Continued)

FOREIGN PATENT DOCUMENTS

CN    101355096 A    1/2009
CN    104143561 A    11/2014
(Continued)

OTHER PUBLICATIONS

European search report dated Jun. 12, 2020, issued in the corresponding European Patent Application No. 19215895.4.

*Primary Examiner* — Lex H Malsawma
(74) *Attorney, Agent, or Firm* — F. CHAU & ASSOCIATES, LLC

(57) ABSTRACT

A display device that includes a substrate having a display area configured for displaying an image and a peripheral area positioned outside of the display area. A first thin film transistor is disposed on the display area. A display element is electrically connected to the first thin film transistor. The display element includes a pixel electrode, an intermediate layer, and an opposite electrode. An embedded driving circuit portion is disposed on the peripheral area. The embedded driving circuit portion includes a second thin film transistor. A common voltage supply line is disposed on the peripheral area. The common voltage supply line is positioned closer to the display area than the embedded driving circuit portion. The common voltage supply line is electrically connected to the opposite electrode.

13 Claims, 15 Drawing Sheets

Related U.S. Application Data continuation of application No. 16/711,989, filed on Dec. 12, 2019, now Pat. No. 11,239,304.

(51) Int. Cl.
    *H10K 50/844*     (2023.01)
    *H10K 59/131*     (2023.01)
    *H10K 59/38*     (2023.01)
    *H10K 59/80*     (2023.01)

(52) U.S. Cl.
    CPC ........... *H10K 59/131* (2023.02); *H10K 59/38* (2023.02); *H10K 59/8722* (2023.02); *H10K 59/873* (2023.02)

(56) References Cited

U.S. PATENT DOCUMENTS

| | | | |
|---|---|---|---|
| 10,020,353 | B2 | 7/2018 | Furuie |
| 11,239,304 | B2 | 2/2022 | Park et al. |
| 11,882,738 | B2 * | 1/2024 | Park .................... H10K 59/126 |
| 2005/0029937 | A1 | 2/2005 | Kim |
| 2006/0001792 | A1 | 1/2006 | Choi |
| 2006/0250083 | A1 | 11/2006 | Oh et al. |
| 2007/0096135 | A1 | 5/2007 | Matsumoto |
| 2009/0026932 | A1 | 1/2009 | Kwak et al. |
| 2014/0332769 | A1 | 11/2014 | Lee et al. |
| 2017/0033312 | A1 | 2/2017 | Kim et al. |
| 2017/0287995 | A1 | 10/2017 | Kim et al. |
| 2017/0309694 | A1 | 10/2017 | Furuie |
| 2018/0033998 | A1 | 2/2018 | Kim et al. |
| 2018/0122890 | A1 | 5/2018 | Park et al. |
| 2018/0151642 | A1 | 5/2018 | Oh |
| 2018/0151838 | A1 | 5/2018 | Park et al. |
| 2018/0188189 | A1 | 7/2018 | Hwang |
| 2018/0226454 | A1 | 8/2018 | Liu et al. |
| 2020/0194534 | A1 | 6/2020 | Park et al. |
| 2022/0123098 | A1 | 4/2022 | Park et al. |

FOREIGN PATENT DOCUMENTS

| | | |
|---|---|---|
| CN | 107275506 A | 10/2017 |
| CN | 108253898 A | 7/2018 |
| EP | 2019432 | 1/2009 |
| JP | 2007-157470 | 6/2007 |
| JP | 2016-119146 | 6/2016 |
| KR | 10-0830331 | 5/2008 |
| KR | 10-2015-0016784 | 2/2015 |
| KR | 10-2017-0090382 | 8/2017 |
| KR | 10-2018-0013452 | 2/2018 |
| KR | 10-2018-0047536 | 5/2018 |
| KR | 10-2018-0060851 | 6/2018 |
| KR | 10-2018-0061866 | 6/2018 |

* cited by examiner

DISPLAY DEVICE INCLUDING A PROTRUDING SUPPORT

CROSS-REFERENCE TO RELATED APPLICATIONS

This application is a continuation of U.S. patent application Ser. No. 17/567,254 filed on Jan. 3, 2022, which is a continuation of U.S. patent application Ser. No. 16/711,989 filed on Dec. 12, 2019, now U.S. Pat. No. 11,239,304, which claims priority under 35 U.S.C. § 119 to Korean Patent Application No. 10-2018-0161182, filed on Dec. 13, 2018 in the Korean Intellectual Property Office, the disclosures of which are incorporated by reference in their entireties herein.

1. TECHNICAL FIELD

The present inventive concepts relate to a display device.

2. DISCUSSION OF RELATED ART

A display device is a device for visually displaying images. Such a display device may include a substrate that is partitioned into a display area and a peripheral area. The display area may include a scan line and a data line formed to be insulated from each other and includes a plurality of pixels. Furthermore, the display area may include a thin-film transistor and a pixel electrode electrically connected to the thin-film transistor corresponding to each of the pixels. The display area may also include an opposite electrode commonly provided in the pixels. The peripheral area may include various wirings for transmitting an electrical signal to the display area, a scan driver, a data driver, and a controller.

The usage of such display devices has diversified. Accordingly, the designs of peripheral areas of display devices have also diversified and a reduction of the size of the peripheral area is often desired.

SUMMARY

One or more exemplary embodiments include a display device that reduces a space occupied by a peripheral area and implements a high-quality image. However, exemplary embodiments of the present inventive concepts are not limited thereto.

Additional aspects will be set forth in part in the description which follows and, in part, will be apparent from the description, or may be learned by practice of the presented embodiments.

According to one or more embodiments, a display device includes a substrate having a display area configured for displaying an image and a peripheral area positioned outside of the display area. A first thin film transistor is disposed on the display area. A display element is electrically connected to the first thin film transistor. The display element includes a pixel electrode, an intermediate layer, and an opposite electrode. An embedded driving circuit portion is disposed on the peripheral area. The embedded driving circuit portion includes a second thin film transistor. A common voltage supply line is disposed on the peripheral area. The common voltage supply line is positioned closer to the display area than the embedded driving circuit portion. The common voltage supply line is electrically connected to the opposite electrode.

The display device may further include: a planarization layer covering at least a portion of the embedded driving circuit portion; and a shielding layer on the planarization layer, the shielding layer at least partially overlapping the embedded driving circuit portion. The planarization layer may include a via hole exposing the common voltage supply line.

The shielding layer may include a same material as the pixel electrode and may be in contact with the common voltage supply line through the via hole. A portion of the shielding layer may be in contact with the opposite electrode.

The shielding layer may be integrated with the opposite electrode and may be in contact with the common voltage supply line through the via hole.

The shielding layer may include: a first shielding layer including a same material as the pixel electrode; and a second shielding layer extending from the opposite electrode.

The shielding layer may include a plurality of through holes.

The display device may further include: a dam portion outside the common voltage supply line, the dam portion protruding from the substrate. The dam portion may at least partially overlap the embedded driving circuit portion.

The dam portion may include a first dam and a second dam which are spaced apart from each other. A height of the first dam and a height of the second dam may be substantially equal to each other.

The dam portion may include a first layer and a second layer, and a side surface of the first layer may be curved by a halftone mask process.

The display device may further include: a support outside the dam portion, the support protruding from an upper surface of the substrate. A height of the support from the upper surface of the substrate may be less than a height of the dam portion from the upper surface of the substrate.

The display device may further include: a wiring portion outside the embedded driving circuit portion, the wiring portion transmitting a signal to the embedded driving circuit portion. At least one of the dam portion and the support may at least partially overlap the wiring portion.

The display device may further include: a planarization layer between the first thin film transistor and the display element, the planarization layer including an organic material; and an inorganic protective layer between the planarization layer and the first thin film transistor. The inorganic protective layer may cover a source electrode and a drain electrode of the first thin film transistor and extend to the peripheral area. In the peripheral area, the inorganic protective layer may include the planarization layer and an area that is not covered by an organic material formed in a same layer as the planarization layer.

The inorganic protective layer may include a hole exposing the common voltage supply line. A conductive protective layer for protecting the common voltage supply line may be arranged to correspond to the hole.

The display device may further include: a thin-film encapsulation layer covering the display area, the thin-film encapsulation layer including at least one inorganic encapsulation layer and at least one organic encapsulation layer. In the peripheral area, the at least one inorganic encapsulation layer may be in contact with the inorganic protective layer.

The display device may further include: a color filter glass facing the substrate; and a sealing member outside the peripheral area, the sealing member adhering the substrate and the color filter glass together.

According to one or more exemplary embodiments of the present inventive concepts, a display device includes a substrate having a display area configured for displaying an image and a peripheral area positioned outside of the display area. A first thin film transistor is disposed on the display area. A display element is electrically connected to the first thin film transistor. A planarization layer is disposed between the first thin film transistor and the display element. The planarization layer includes an organic material. An inorganic protective layer is disposed between the planarization layer and the first thin film transistor. The inorganic protective layer covers a source electrode and a drain electrode of the first thin film transistor and extends to the peripheral area. A thin-film encapsulation layer covers the display area. The thin-film encapsulation layer includes at least one inorganic encapsulation layer and at least one organic encapsulation layer. The inorganic encapsulation layer contacts the inorganic protective layer in the peripheral area.

The display device may further include a dam portion disposed on the peripheral area, the dam portion protruding from the substrate; and an embedded driving circuit portion disposed on the peripheral area, the embedded driving circuit portion comprising a second thin film transistor. The inorganic encapsulation layer contacts the inorganic protective layer in the peripheral area farther from the display area than the dam portion.

The display device may further include: a planarization layer covering at least a portion of the embedded driving circuit portion; and a shielding layer on the planarization layer. The shielding layer may at least partially overlapping the embedded driving circuit portion. The planarization layer may include a via hole exposing the common voltage supply line.

The dam portion may at least partially overlap the second thin film transistor of the embedded driving circuit portion.

The display device may further include: a wiring portion outside the embedded driving circuit portion; and a protruding portion outside the dam portion. The protruding portion may have a lower height than the dam portion. At least one of the dam portion and the protruding portion may overlap the wiring portion.

The display device may further include: a sealing member outside the protruding portion; and an upper substrate facing the substrate. The substrate and the upper substrate may be adhered together by the sealing member.

According to one or more embodiments, a display device includes a substrate having a display area configured for displaying an image and a peripheral area outside the display area. A first thin film transistor is disposed on the display area. A display element is electrically connected to the first thin film transistor. The display element includes a pixel electrode, an intermediate layer, and an opposite electrode. An embedded driving circuit portion is disposed on the peripheral area. The embedded driving circuit portion includes a second thin film transistor. A wiring portion is disposed at one side of the embedded driving circuit portion. The wiring portion has wirings connected to the embedded driving circuit portion. A first shielding layer is at least partially overlapping the second thin film transistor with a planarization layer disposed between the first shielding layer and the second thin film transistor. The first shielding layer includes a same material as a material of the pixel electrode. A second shielding layer is disposed on the first shielding layer. The second shielding layer extends from the opposite electrode. An end of the second shielding layer is disposed between the wiring portion and the display area.

The first shielding layer may include a plurality of through holes.

The display device may further include: an inorganic protective layer between the second thin film transistor and the planarization layer; and a conductive protective layer between the inorganic protective layer and the planarization layer. The conductive protective layer may include a conductive material. The conductive protective layer may overlap the second thin film transistor.

The display device may further include: a dam portion in the peripheral area, the dam portion protruding from the substrate. The dam portion may at least partially overlap the embedded driving circuit portion.

The display device may further include: a planarization layer between the first thin film transistor and the display element, the planarization layer including an organic material; and an inorganic protective layer between the planarization layer and the first thin film transistor. The inorganic protective layer may cover a source electrode and a drain electrode of the first thin film transistor and extend to the peripheral area. In the peripheral area, the inorganic protective layer may include the planarization layer and an area that is not covered by an organic material formed in a same layer as the planarization layer.

According to an exemplary embodiment of the present inventive concepts, a display device includes a substrate having a display area configured for displaying an image and a peripheral area positioned outside of the display area. The peripheral area includes a top peripheral area, a bottom peripheral area, a left peripheral area and a right peripheral area. A first thin film transistor is disposed on the display area. A display element is electrically connected to the first thin film transistor. The display element includes a pixel electrode, an intermediate layer, and an opposite electrode. An embedded driving circuit portion is disposed on the left peripheral area and right peripheral area. The embedded driving circuit portion includes a second thin film transistor. A common voltage supply line is disposed on at least one of the top peripheral area and bottom peripheral area and not disposed on the left peripheral area and the right peripheral area. The common voltage supply line is electrically connected to the opposite electrode.

Aspects, features, and advantages other than the aforementioned descriptions may be understood more readily by reference to the following accompanying drawings, claims, and detailed descriptions of embodiments.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF THE EXEMPLARY EMBODIMENTS

Figure 1:
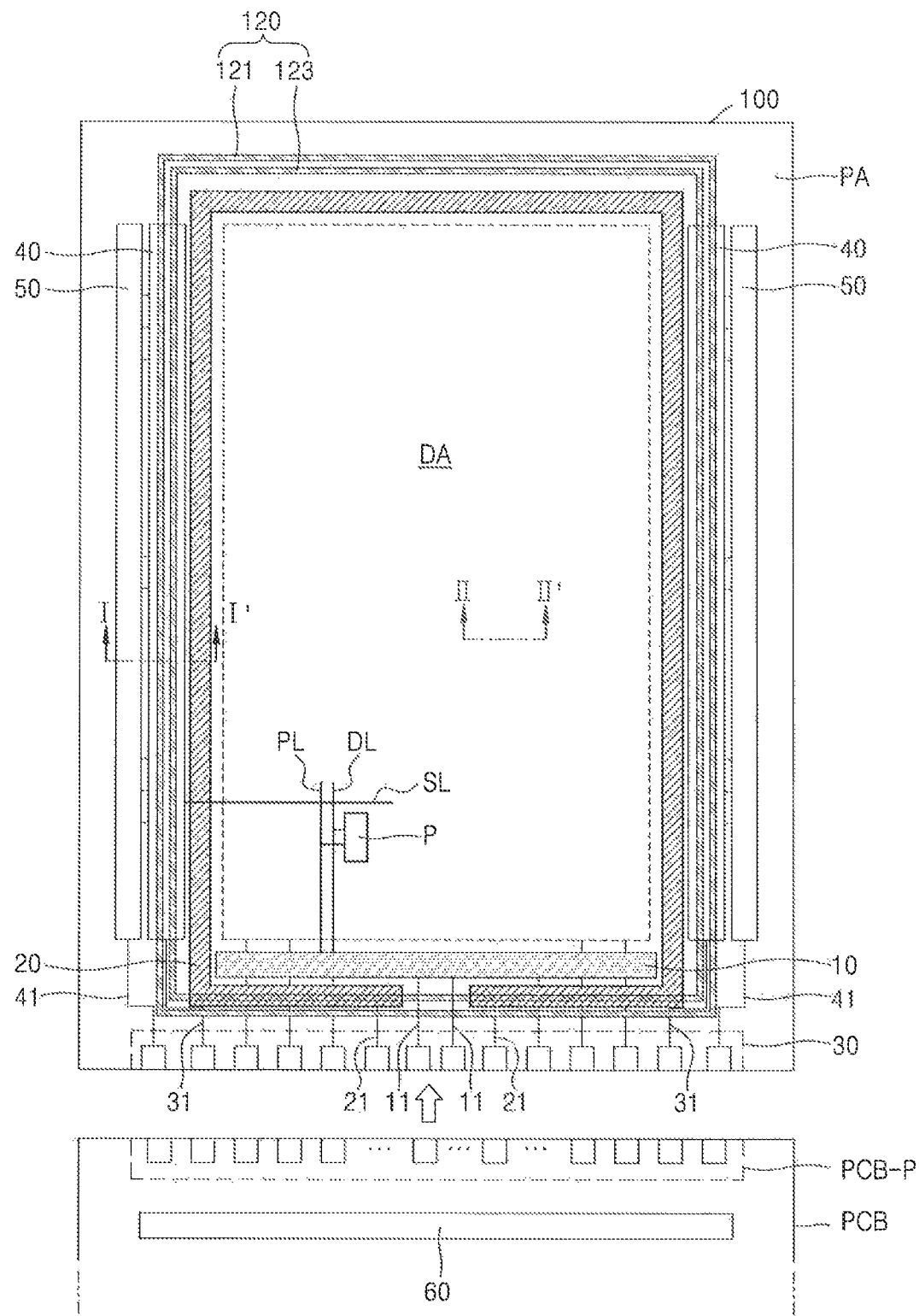
FIG. 1 is a plan view of a display device according to an exemplary embodiment of the present inventive concepts.

While the disclosure may have diverse modified embodiments, exemplary embodiments are illustrated in the drawings and are described in the detailed description. Advantages and features of the exemplary embodiments, and implementation methods thereof will be clarified through the following embodiments described with reference to the accompanying drawings. In this regard, an embodiment of the disclosure may have different forms and should not be construed as being limited to the descriptions set forth herein.

Reference will now be made in detail to exemplary embodiments, examples of which are illustrated in the accompanying drawings, wherein like reference numerals refer to like elements throughout, and repeated description thereof will be omitted.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprise", "include" and/or "have" used herein specify the presence of stated features or components, but do not preclude the presence or addition of one or more other features or components.

It will be understood that when a film, region, or element is referred to as being "on" another portion, it may be directly or indirectly on the other portion. For example, intervening films, regions, or elements may be present.

Sizes of components in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly connected to the portion through another layer, region, or component.

Furthermore, an x-axis, a y-axis, and a z-axis are not limited to three axes on an orthogonal coordinate system. For example, the x-axis, the y-axis, and the z-axis may be perpendicular to one another or may represent different directions that are not perpendicular to one another.

Display devices may be used to display images, texts, etc. and may be classified into liquid crystal displays, electrophoretic displays, organic light-emitting displays, inorganic light-emitting displays, quantum dot light emitting displays, field emission displays, surface-conduction electron-emitter displays, and plasma displays.

Hereinafter, an organic light-emitting display will be described as a display device according to an exemplary embodiment, but display devices according to exemplary embodiments of the present inventive concepts are not limited thereto and various kinds of display devices may be used.

FIG. 1 is a plan view of a display device according to an exemplary embodiment of the present inventive concepts.

Referring to FIG. 1, the display device may include a display area DA and a peripheral area PA arranged around the display area DA. The display device may generate an image by using light emitted from a plurality of pixels arranged in the display area DA.

The display area DA may include pixels P connected to a data line DL extending in a first direction and a scan line SL extending in a second direction intersecting the first direction. Each of the pixels P may also be connected to a driving voltage line PL extending in the first direction.

Each of the pixels P may include a display element such as an organic light-emitting element. In exemplary embodiments, each pixel P may emit light of, for example, red, green, blue or white through an organic light-emitting element. The pixel P in the present specification may be understood as a pixel that emits light of any one of red, green, blue, and white as described above.

Each pixel P may be electrically connected to embedded circuits arranged in the peripheral area PA. The peripheral area PA may include an embedded driving circuit portion 40, a wiring portion 50, a terminal portion 30, a first power supply line 10, and a second power supply line 20.

The embedded driving circuit portion 40 may include a plurality of thin film transistors (TFTs) and may provide a scan signal to each pixel P through a scan line SL. In an exemplary embodiment, the embedded driving circuit portion 40 may be arranged on both sides of the display area DA with the display area DA therebetween. A portion of the pixels P arranged in the display area DA may be electrically connected to the embedded driving circuit portion 40 arranged on the left side of the display area DA, and the remaining pixels P may be electrically connected to the embedded driving circuit portion 40 arranged on the right side of the display area DA. In another exemplary embodiment, the embedded driving circuit portion 40 may be arranged only on one side of the display area DA.

The wiring portion 50 may be arranged on one side of the embedded driving circuit portion 40. The wiring portion 50 refers to a region where wirings for transmitting signals for driving the embedded driving circuit portion 40 are arranged. For example, as shown in FIG. 1, the wiring portion 50 may be positioned in the peripheral area PA adjacent to the embedded driving circuit portion 40 and disposed farther from the display area DA than the embedded driving circuit portion.

The terminal portion 30 may be arranged on one side of the substrate 100. The terminal portion 30 may be exposed without being covered by an insulating layer. The terminal portion 30 may be electrically connected to a printed circuit board PCB. A terminal PCB-P of the printed circuit board PCB may be electrically connected to the terminal portion 30.

The printed circuit board PCB may transfer a signal or a power of a control portion to the terminal portion 30. The control portion may provide a driving voltage ELVDD and a common voltage ELVSS (see FIGS. 2A and 2B to be described later) to the first and second power supply line 10 and 20 through first and second connection lines 11 and 21, respectively. The driving voltage ELVDD may be provided to each pixel P through the driving voltage line PL connected to the first power supply line 10, and the common voltage ELVSS may be provided to an opposite electrode of the pixel P connected to the second power supply line 20. The second power supply line 20 may at least partially surround the display area DA. The second power supply line 20 may at least partially surround the first power supply line 10. In another exemplary embodiment, the second power supply line 20 may be arranged between the first power supply line 10 and the display area DA. As shown in the exemplary embodiment of FIG. 1, the second power supply line 20 may be arranged between the embedded driving circuit portion 40 and the display area DA. Since the second power supply line 20 provides a common voltage, the second power supply line 20 may be referred to as a common voltage supply line. The second power supply line 20 may be arranged in the peripheral area PA adjacent the upper side, the lower side, the left side, and the right side of the display area DA as shown in FIG. 1. However, the exemplary embodiments of the present inventive concepts are not limited thereto. For example, the second power supply line 20 may be arranged to correspond to at least one of the upper, lower, left, and right sides of the display area DA.

A control signal generated in the control portion may be transmitted to the embedded driving circuit portion 40 and the wiring portion 50 through the printed circuit board PCB and third and fourth connection lines 31 and 41. In addition, a signal transmitted to the wiring portion 50 may be transmitted to the embedded driving circuit portion 40.

A data driving circuit 60 may be electrically connected to the data line DL. A data signal of the data driving circuit 60 may be provided to each pixel P through a connection line connected to the terminal portion 30 and the data line DL connected to the connection line. FIG. 1 shows that the data driving circuit 60 is disposed on the printed circuit board PCB, but in another exemplary embodiment, the data driving circuit 60 may be disposed on the substrate 100. For example, the data driving circuit 60 may be disposed between the terminal portion 30 and the first power supply line 10.

A dam portion 120 may be disposed in the peripheral area PA. The dam portion 120 may include at least one dam. FIG. 1 shows a structure in which two dams, including the first and second dams 121 and 123, are arranged. The dam portion 120 may prevent an organic material from flowing toward the edge of the substrate 100 when an organic encapsulation layer 420 of a thin-film encapsulation layer 400 is formed (see FIG. 3A). Therefore, the formation of an edge tail of the organic encapsulation layer 420 may be prevented. The dam portion 120 on the peripheral area PA may surround at least a portion of the display area DA. When a plurality of dams are provided, such as the first and second dams 121, 123, the first dam and the second dam may be spaced apart from each other and the first dam may be arranged to surround at least a portion of the second dam.

In some exemplary embodiments, at least a portion of the dam 120 may overlap the embedded driving circuit portion 40. For example, either the first dam 121 or the second dam 123 may overlap the embedded driving circuit portion 40. In other embodiments, both the first dam 121 and the second dam 123 may overlap the embedded driving circuit portion 40 as shown in FIG. 1.

In some exemplary embodiments, at least a portion of the dam portion 120 may overlap the wiring portion 50. For example, either the first dam 121 or the second dam 123 may overlap the wiring portion 50. In other embodiments, both the first dam 121 and the second dam 123 may overlap the wiring portion 50.

Since the dam portion 120 overlaps the embedded driving circuit portion 40 and/or the wiring portion 50, it may not be necessary to provide a separate dedicated area in the peripheral area PA for the dam portion 120. Therefore, the size of the peripheral area PA may be reduced.

On the underside of the display area DA, the dam portion 120 may overlap the second power supply line 20. However, the present disclosure is not limited thereto. Various modifications may be made thereto. For example, the dam portion 120 may overlap the first power supply line 10, or the first dam 121 may overlap the second power supply line 20 and the second dam 123 may overlap the first power supply line 10, etc.

Figure 2A:
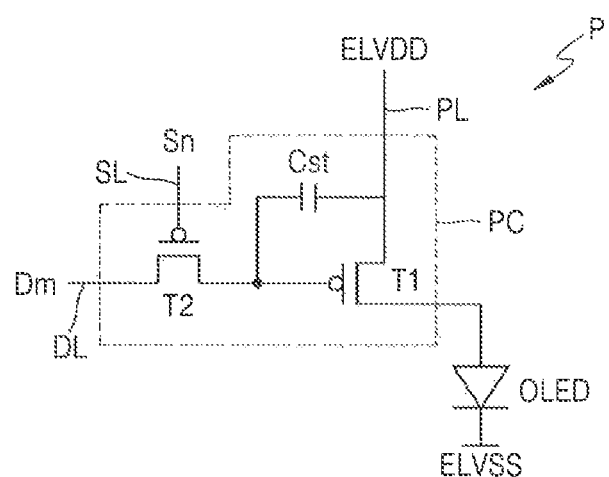
FIG. 2A is an equivalent circuit diagram of a pixel in the display device of FIG. 1, according to an exemplary embodiment of the present inventive concepts.
Figure 2B:
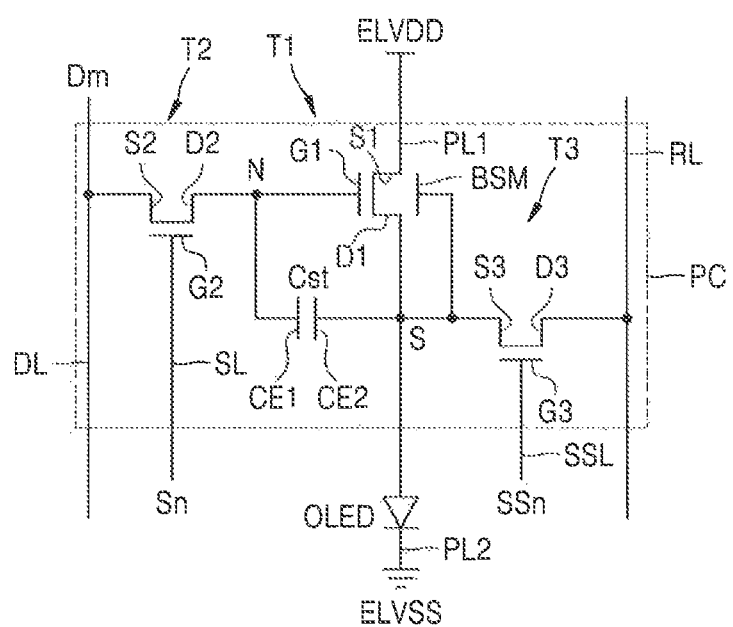
FIG. 2B is an equivalent circuit diagram of a pixel in the display device of FIG. 1, according to another exemplary embodiment of the present inventive concepts.

FIGS. 2A and 2B are equivalent circuit diagrams of any one pixel in a display device according to an exemplary embodiment.

Referring to FIG. 2A, each pixel P may include a pixel circuit PC connected to a scan line SL and a data line DL and an organic light-emitting diode OLED connected to the pixel circuit PC.

The pixel circuit PC may include a driving TFT T1, a switching TFT T2, and a storage capacitor Cst. The switching TFT T2 may be connected to the scan line SL and the data line DL and may transfer a data signal Dm input through the data line DL to the driving TFT T1 according to the scan signal Sn.

The storage capacitor Cst may be connected to the switching TFT T2 and a driving voltage line PL and may store a voltage corresponding to a difference between a voltage received from the switching TFT T2 and a first power supply voltage, e.g., a driving voltage ELVDD, supplied to the driving voltage line PL.

The driving TFT T1 may be connected to the driving voltage line PL and the storage capacitor Cst and may control a driving current flowing through the organic light-emitting device OLED from the driving voltage line PL corresponding to a voltage value stored in the storage capacitor Cst. The organic light-emitting device OLED may emit light having predetermined luminance according to the driving current.

Although FIG. 2A illustrates a case where the pixel circuit PC includes two TFTs and one storage capacitor Cst, the exemplary embodiments of the present inventive concepts are not limited thereto.

Referring to FIG. 2B, each pixel PX may include an organic light-emitting diode OLED, and a pixel circuit PC including a plurality of TFTs that drive the organic light-emitting diode OLED. The pixel circuit PC may include a driving TFT T1, a switching TFT T2, a sensing TFT T3, and a storage capacitor Cst.

A scan line SL may be connected to a gate electrode G2 of the switching TFT T2. A data line DL may be connected to a source electrode S2 of the switching TFT T2. A first electrode CE1 of the storage capacitor Cst may be connected to a drain electrode D2 of the switching TFT T2.

Accordingly, the switching TFT T2 supplies a data voltage of the data line DL to a first node N in response to a scan signal Sn from the scan line SL of each pixel PX.

A gate electrode G1 of the driving TFT T1 may be connected to the first node N, a source electrode S1 of the driving TFT T1 may be connected to a first power line PL1 for transferring a driving power supply voltage ELVDD, and a drain electrode D1 of the driving TFT T1 may be connected to an anode electrode of the organic light-emitting diode OLED.

Accordingly, the driving TFT T1 may adjust an amount of a current flowing through the organic light-emitting diode OLED depending on a gate-source voltage of the driving TFT T1, that is, a voltage applied between the driving power supply voltage ELVDD and the first node N.

A gate electrode G3 of the sensing TFT T3 may be connected to a sensing control line SSL. A source electrode S3 of the sensing TFT T3 may be connected to a second node S. A drain electrode D3 of the sensing TFT T3 may be connected to a reference voltage line RL. In an exemplary embodiment, the sensing TFT T3 may be controlled by the scan line SL instead of the sensing control line SSL.

The sensing TFT T3 may sense an electric potential of an anode electrode of the organic light-emitting diode OLED. The sensing TFT T3 may supply a pre-charging voltage from the reference voltage line RL to the second node S in response to a sensing signal SSn from the sensing control line SSL, or supply a voltage of the anode electrode of the organic light-emitting diode OLED to the reference voltage line RL during a sensing period.

The first electrode CE1 of the storage capacitor Cst may be connected to the first node N. A second electrode CE2 of the storage capacitor Cst may be connected to the second node S. The storage capacitor Cst may be charged with a voltage difference between voltages that are respectively supplied to the first node N and the second node S and may supply a driving voltage to the driving TFT T1. For example, the storage capacitor Cst may be charged with a voltage difference between a data voltage Dm and a pre-charging voltage that are respectively supplied to the first node N and the second node S.

A bias electrode BSM may be formed to face the driving TFT T1 and may be connected to the source electrode S3 of the sensing TFT T3. Since the bias electrode BSM receives a voltage by cooperating with an electric potential of the source electrode S3 of the sensing TFT T3, the driving TFT T1 may be stabilized. In an exemplary embodiment, the bias electrode BSM may not be connected to the source electrode S3 of the sensing TFT T3 and may be connected to a separate bias wiring.

An opposite electrode (e.g. a cathode) of the organic light-emitting diode OLED may receive a common power voltage ELVSS. The organic light-emitting diode OLED may emit light by receiving a driving current from the driving TFT T1.

Although FIG. 2B shows an embodiment where each pixel PX includes the signal lines SL, SSL, and DL, the reference voltage line RL, the first power line PL1, and the second power line PL2, the present disclosure is not limited thereto. For example, at least one of the signal lines SL, SSL, and DL, and the reference voltage line RL, the first power line PL1, and the second power line PL2 may be shared by neighboring pixels.

Exemplary embodiments of the present inventive concepts for the pixel circuit PC are not limited to the number of thin film transistors and storage capacitors and the circuit design, described with reference to FIGS. 2A and 2B, and the number and the circuit design may be variously changed.

Figure 3A:
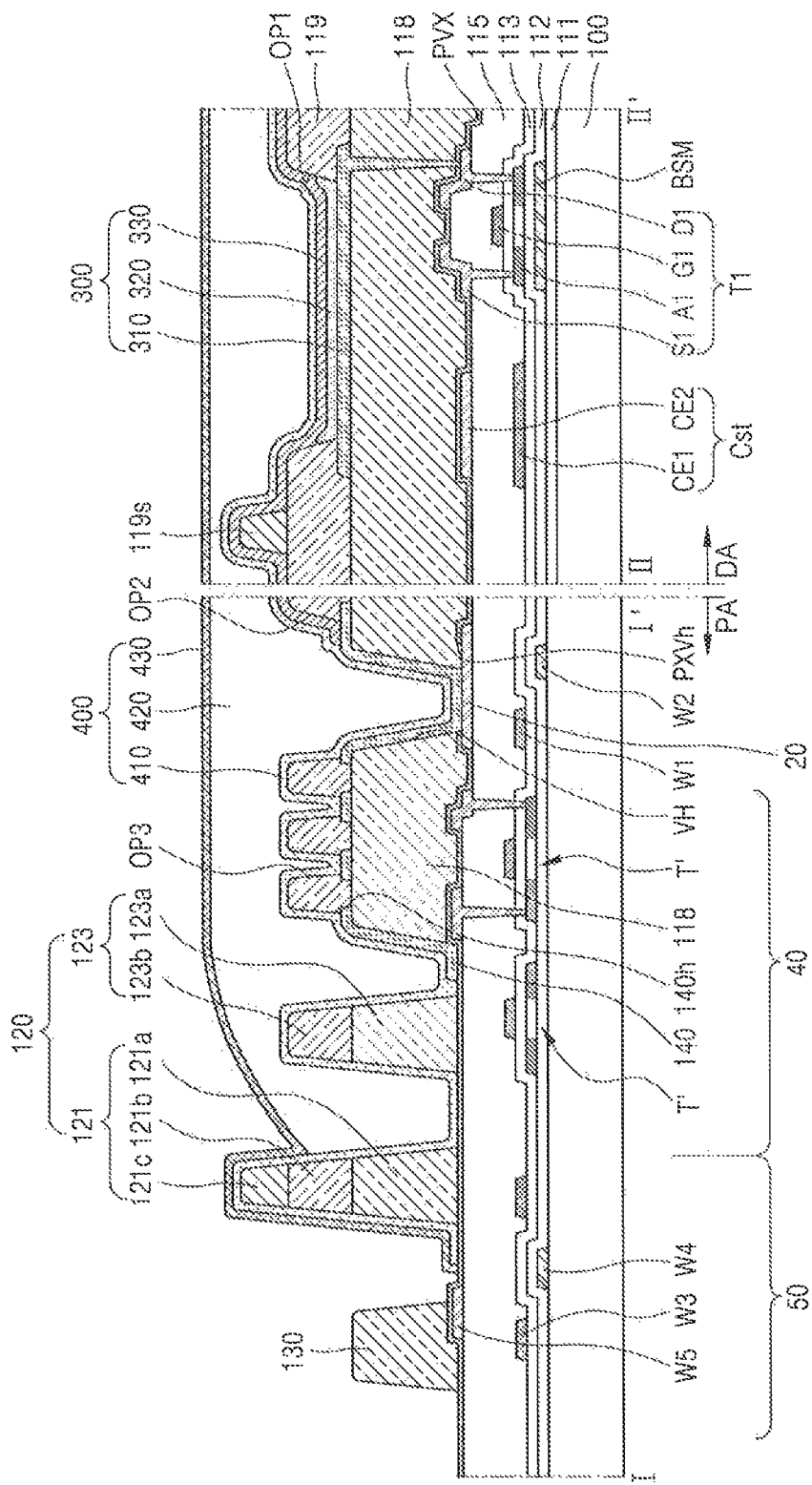
FIG. 3A is a cross-sectional view of a display device according to an exemplary embodiment of the present inventive concepts, taken along lines I-I' and II-II' of FIG. 1.
Figure 3B:
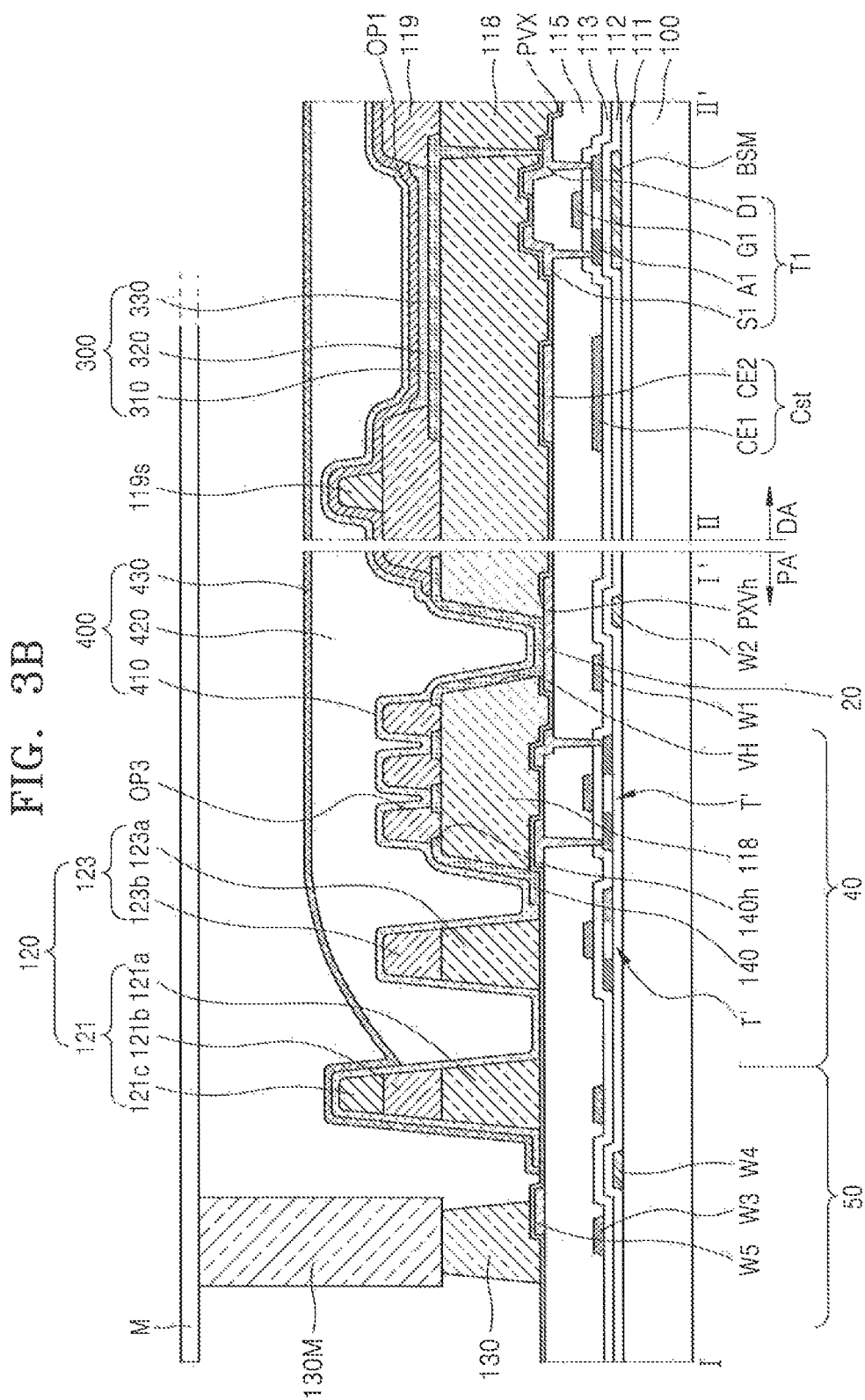
FIG. 3B is a cross-sectional view of a display device which includes a mask support on a support taken along lines I-I' and II-II' of FIG. 1 according to an exemplary embodiment of the present inventive concepts.

FIG. 3A is a cross-sectional view of a display device according to an exemplary embodiment taken along lines I-I' and II-II' of FIG. 1, respectively. FIG. 3B is a cross-sectional view of a display device which includes a mask support on a support taken along lines I-I' and II-II' of FIG. 1 which may explain the role of the support for the display device.

Referring to FIG. 3A, the display device according to the present exemplary embodiment may include a display area DA and a peripheral area PA outside the display area DA. At least one TFT, e.g., a driving TFT T1, and a display element connected to the at least one TFT may be arranged on the display area DA. A second power supply line 20, which is a common voltage supply line, an embedded driving circuit portion 40, a wiring portion 50, a shielding layer 140, a dam portion 120, and a support 130 may be arranged in the peripheral area PA.

The display device according to the present exemplary embodiment further includes a thin-film encapsulation layer 400 sealing the display area DA and a portion of the peripheral area PA. A first inorganic encapsulation layer 410 and/or a second inorganic encapsulation layer 430 of the thin-film encapsulation layer 400 may be in contact with an inorganic protective layer PVX.

In the present exemplary embodiment, the second power supply line 20 may be arranged closer to the display area DA than the embedded driving circuit portion 40. The shielding layer 140 may at least partially overlap the embedded driving circuit portion 40. The dam portion 120 may overlap the embedded driving circuit portion 40 and/or the wiring portion 50.

Hereinafter, the display device according to an exemplary embodiment will be described in more detail.

In the display area DA of FIG. 3A, the driving TFT T1 and the storage capacitor Cst in the pixel circuit PC of each pixel P described with reference to FIGS. 2A and 2B are shown. For convenience of description, elements arranged in the display area DA of FIG. 3 will be described according to the order in which they are stacked.

A substrate 100 may include a glass material, a ceramic material, a metal material, or a flexible or bendable material. In an embodiment where the substrate 100 is flexible or bendable, the substrate 100 may include a polymer resin such as polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a single-layered or multi-layered structure including the above materials. In the embodiment where the substrate 100 has a multi-layered structure, the substrate 100 may further include an inorganic layer. In an exemplary embodiment, the substrate 100 may have a structure of an organic material/inorganic material/organic material.

A first buffer layer 111 may increase planarization of a top surface of the substrate 100. The first buffer layer 111 may include $SiO_2$, SiNx, SiON, $Al_2O_3$, $TiO_2$, $Ta_2O$, $HfO_2$, or $ZnO_2$.

A barrier layer may be further arranged between the substrate 100 and the first buffer layer 111. The barrier layer may prevent or minimize penetration of impurities into a semiconductor layer A1 from the substrate 100, etc. The barrier layer may include an inorganic material such as an oxide or a nitride, an organic material, or an organic/inorganic composite material. The barrier layer may have a single-layered or multi-layered structure.

A bias electrode BSM may be arranged on the first buffer layer 111 to correspond to the driving TFT T1 and the storage capacitor Cst. A voltage may be applied to the bias electrode BSM. For example, the bias electrode BSM may be connected to the source electrode S3 (see FIG. 2B) of the sensing TFT T3 (see FIG. 2B) and may receive a voltage of the source electrode S3. Also, the bias electrode BSM may prevent external light from reaching the semiconductor layer A1. Therefore, a characteristic of the driving TFT T1 may be stabilized.

The second buffer layer 112 may cover the bias electrode BSM and may be formed over the entire surface of the substrate 100. In an exemplary embodiment, the second buffer layer 112 may include $SiO_2$, SiNx, SiON, $Al_2O_3$, $TiO_2$, $Ta_2O$, $HfO_2$, or $ZnO_2$.

The semiconductor layer A1 may be arranged on the second buffer layer 112. The semiconductor layer A1 may include amorphous silicon or polycrystalline silicon. In another exemplary embodiment, the semiconductor layer A1 may include an oxide of at least one of In, Ga, Sn, Zr, V, Hf, Cd, Ge, Cr, Ti, Al, Cs, Ce, and Zn. In an exemplary embodiment, the semiconductor layer A1 may include, a Zn oxide-based material, such as Zn oxide, In—Zn oxide, and Ga—In—Zn oxide. In another exemplary embodiment, the semiconductor layer A1 may include a semiconductor including IGZO(In-Ga—Zn-O), ITZO(In—Sn—Zn—O), or IGTZO(In—Ga—Sn—Zn—O) in which ZnO contains metal such as In, Ga, or Sn. The semiconductor layer A1 may include a channel region, and a source region and a drain region arranged on two opposite sides of the channel region. The semiconductor layer A1 may include a single layer or a multi-layer.

A gate electrode G1 may be arranged over the semiconductor layer A1 with a gate insulating layer 113 disposed therebetween to at least partially overlap the semiconductor layer A1. The gate electrode G1 may include one of Mo, Al, Cu, and Ti, and may include a single layer or a multi-layer. For example, the gate electrode G1 may include a single layer including Mo. A first electrode CE1 of the storage capacitor Cst may be arranged in the same layer as the gate electrode G1. The first electrode CE1 may include the same material as the gate electrode G1.

An interlayer insulating layer 115 may be provided to cover the gate electrode G1 and the first electrode CE1 of the storage capacitor Cst. The interlayer insulating layer 115 may include $SiO_2$, SiNx, SiON, $Al_2O_3$, $TiO_2$, $Ta_2O$, $HfO_2$, or $ZnO_2$.

A second electrode CE2 of the storage capacitor Cst, a source electrode S1, a drain electrode D1, and a data line DL may be arranged on the interlayer insulating layer 115.

The second electrode CE2 of the storage capacitor Cst, the source electrode S1, the drain electrode D1, and the data line DL may include a conductive material including one of Mo, Al, Cu, and Ti, and may include a single layer or multi-layer including the above material. For example, the second electrode CE2, the source electrode S1, the drain electrode D1, and the data line DL may have a multi-layered structure of Ti/Al/Ti. The source electrode S1 and the drain electrode D1 may be respectively connected to the source region and the drain region of the semiconductor layer A1 through contact holes.

The second electrode CE2 of the storage capacitor Cst overlaps the first electrode CE1 with the interlayer insulating layer 115 therebetween and may include a capacitance. In this embodiment, the interlayer insulating layer 115 may serve as a dielectric layer of the storage capacitor Cst.

The second electrode CE2 of the storage capacitor Cst, the source electrode S1, the drain electrode D1, and the data line DL may be covered by an inorganic protective layer PVX.

The inorganic protective layer PVX may include a single layer or multi-layer including SiNx and SiOx. The inorganic protective layer PVX may be introduced to cover and protect some wirings arranged on the interlayer insulating layer 115. Wirings formed together with the data line DL in the same process as the data line DL may be exposed in a portion of the substrate 100 (for example, a portion of a peripheral area). Exposed portions of the wirings may be damaged by an etchant used in patterning a pixel electrode 310 to be described later. However, since the inorganic protective layer PVX covers the data line DL and at least portions of the wirings formed together with the data line DL as in the present embodiment, the inorganic protective layer PVX may prevent the wirings from being damaged in a process of patterning the pixel electrode 310.

A planarization layer 118 may be arranged on the inorganic protective layer PVX and an organic light-emitting diode OLED may be arranged on the planarization layer 118.

The planarization layer 118 may include a single layer or multi-layer including an organic material and may provide a flat top surface. The planarization layer 118 may include a general-purpose polymer such as benzocyclobutene (BCB), polyimide, hexamethyldisiloxane (HMDSO), polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The organic light-emitting diode OLED 300 may be arranged on the planarization layer 118 in the display area DA of the substrate 100. The organic light-emitting diode OLED 300 may include the pixel electrode 310, an intermediate layer 320 including an organic emission layer, and an opposite electrode 330.

The pixel electrode 310 may include a (semi) transmissive electrode or a reflective electrode. In an exemplary embodiment, the pixel electrode 310 may include a reflective layer including one of Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one of indium tin oxide (ITO), zinc oxide (IZO), zinc oxide (ZnO), indium oxide ($In_2O_3$), indium gallium oxide (IGO), or aluminum zinc oxide (AZO). In an exemplary embodiment, the pixel electrode 310 may include ITO/Ag/ITO.

A pixel-defining layer 119 may be arranged on the planarization layer 118. The pixel-defining layer 119 may define an emission area of a pixel by including an opening corresponding to each sub-pixel in the display area DA. A first opening OP1 may expose at least a central portion of the pixel electrode 310. The pixel-defining layer 119 may prevent an arc, etc. from occurring at an edge of the pixel electrode 310 by increasing a distance between the edge of the pixel electrode 310 and the opposite electrode 330 over the pixel electrode 310.

The pixel-defining layer 119 may be formed by a method such as spin coating using at least one organic insulating material among polyimide, polyamide, an acrylic resin, BCB, and a phenolic resin.

The intermediate layer 320 of the organic light-emitting diode OLED may include an organic emission layer. The organic emission layer may include an organic material including a fluorescent or phosphorescent material that emits red, green, blue, or white light. The organic emission layer may include a low molecular weight or polymer organic material. A functional layer such as a hole transport layer (HTL), a hole injection layer (HIL), an electron transport layer (ETL), and an electron injection layer (EIL) may be selectively further arranged under and on the organic emission layer. The intermediate layer 320 may correspond to each of a plurality of pixel electrodes 310. However, exemplary embodiments of the intermediate layer 320 are not limited thereto. The intermediate layer 320 may include a layer that is one unitary body over the plurality of pixel electrodes 310. However, various modifications may be made.

The opposite electrode 330 may include a light-transmissive electrode or a reflective electrode. In an exemplary embodiment, the opposite electrode 330 may include a transparent or semi-transparent electrode and may include a metal thin film having a small work function and including one of Li, Ca, LiF/Ca, LiF/Al, Al, Ag, Mg, and a compound thereof. A transparent conductive oxide (TCO) layer such as ITO, IZO, ZnO, or $In_2O_3$ may be further arranged on the metal thin film. The opposite electrode 330 may be disposed over the display area DA and the peripheral area PA and arranged over the intermediate layer 320 and the pixel-defining layer 119. The opposite electrode 330 may be provided as one body over a plurality of organic light-emitting diodes OLED and may overlap with the plurality of pixel electrodes 310.

A spacer 119S for preventing mask chopping may be further provided on the pixel-defining layer 119. The spacer 119S may be integrated with the pixel-defining layer 119. For example, the spacer 119S and the pixel-defining layer 119 may be simultaneously formed in the same process by using a halftone mask process.

Since the organic light-emitting diode OLED may be easily damaged by external moisture or oxygen, a thin-film encapsulation layer 400 may be arranged thereon and may cover and protect the organic light-emitting diode OLED. The thin-film encapsulation layer 400 may cover the display area DA and extend to the peripheral area PA. The thin-film encapsulation layer 400 may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include silicon oxide, silicon nitride, and/or silicon oxynitride. In certain exemplary embodiments, an additional layer such as a capping layer may be arranged between the first inorganic encapsulation layer 410 and the opposite electrode 330. Since the first inorganic encapsulation layer 410 is formed on structures disposed thereunder, the top surface of the first inorganic encapsulation layer 410 is not flat. The organic encapsulation layer 420 may cover the first inorganic encapsulation layer 410 and may have a substantially flat top surface, unlike the first inorganic encapsulation layer 410. Specifically, the organic encapsulation layer 420 may have a substantially flat top surface in a region corresponding to the display area DA. The organic encapsulation layer 420 may include one or more selected from polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include silicon oxide, silicon nitride, and/or triacid silicon nitride.

If a crack occurs in the thin-film encapsulation layer 400 through the above-described multi-layered structure, the thin-film encapsulation layer may prevent the crack from being connected between the first inorganic encapsulation layer 410 and the organic encapsulation layer 420 or between the organic encapsulation layer 420 and the second inorganic encapsulation layer 430. Therefore, the formation of a path through which external moisture or oxygen penetrates into the display area DA may be prevented or minimized by the multi-layered encapsulation layer.

A second power supply line 20, an embedded driving circuit portion 40, a wiring portion 50, a dam portion 120, a support 130, and a shielding layer 140 may be arranged in the peripheral area PA outside the display area DA.

The second power supply line 20 may be positioned adjacent to the display area DA. For example, the second power supply line 20 may be positioned between the embedded driving circuit portion 40 and the display area DA. The second power supply line 20 may be located in the same layer as the source electrode S1 and/or the drain electrode D1 of the driving TFT T1. In this embodiment, the second power supply line 20 may be formed with the same material as the source electrode S1 and/or the drain electrode D1 and at the same time as the source electrode S1 and/or the drain electrode D1 during the manufacturing process of the display device.

A signal transmitted from the embedded driving circuit portion 40 to the display area DA may be transmitted through a first wiring W1 arranged in the same layer as the gate electrode G1 and/or a second wiring W2 arranged in the same layer as the bias electrode BSM.

The planarization layer 118 may have a via hole VH overlapping with the second power supply line 20 and the inorganic protective layer PVX may also have a hole PVXh overlapping with the second power supply line 20. Accordingly, the second power supply line 20 may be in contact with the shielding layer 140 via the via hole VH and the hole PVXh.

One side of the shielding layer 140 may be in contact with the opposite electrode 330 and thus a common voltage ELVSS supplied to the second power supply line 20 may be transmitted to the opposite electrode 330. In an exemplary embodiment, the opposite electrode 330 may extend to the inside of the via hole VH and thus the second power supply line 20 may be in direct contact with the opposite electrode 330 without passing through the shielding layer 140.

The embedded driving circuit portion 40 may provide scan signals and the like to pixels P included in the display area DA and may include a plurality of TFTs T'. The TFTs T' in the embedded driving circuit portion 40 may have the same structures as the driving TFT T1 in the display area DA and may be formed through the same process as the driving TFT T1.

The planarization layer 118 may extend to the peripheral area PA and cover at least a portion of the embedded driving circuit portion 40. The shielding layer 140 may be arranged above the planarization layer 118. The shielding layer 140 may overlap at least a portion of the embedded driving circuit portion 40. The shielding layer 140 may serve to protect the embedded driving circuit portion 40 from static electricity. The shielding layer 140 may extend to the end of the planarization layer 118 and terminate in an area adjacent to the dam portion 120.

A plurality of through holes 140h may be located in the shielding layer 140 arranged on the planarization layer 118. Due to the presence of the plurality of through holes 140h, gas from outgassing occurring in the planarization layer 118 arranged under the shielding layer 140 may easily escape the planarization layer through the through holes.

The shielding layer 140 may be formed with the same material as the pixel electrode 310 and at the same time as pixel electrode 310. For example, the shielding layer 140 may include Ag, Mg, Al, Pt, Pd, Au, Ni, Nd, Ir, Cr, or a compound thereof. In addition, the shielding layer 140 may include at least one of ITO, IZO, ZnO, $In_2O_3$, IGO, and AZO. In an exemplary embodiment, the shielding layer 140 may include ITO/Ag/ITO. As described above, one side of the shielding layer 140 may be in contact with the opposite electrode 330 and a portion of the shielding layer 140 may be in contact with the second power supply line 20.

In the drawings, the shielding layer 140 is shown as not overlapping the dam portion 120. However, the present disclosure is not limited thereto. The shielding layer 140 may extend to the sides and upper portions of first layers 121a and 123a of the dam portion 120 and may be variously modified.

A portion of the pixel-defining layer 119 may extend to the peripheral area PA and may include a second opening OP2 corresponding to the via hole VH in the planarization layer and a plurality of third openings OP3 corresponding to a region between the through holes 140h of the shielding layer 140. The through holes 140h may be covered and protected by the pixel-defining layer 119, and the third openings OP3 may be arranged between the through holes 140h.

A wiring portion 50 may be arranged in the peripheral area PA farther from the display area DA than the embedded driving circuit portion 40. The wiring portion 50 may include a third wiring W3, a fourth wiring W4, and a fifth wiring W5. The third wiring W3 and the fourth wiring W4 may be connected to the terminal portion 30 (see FIG. 1) to transfer a control signal supplied from a control portion. The wiring W5 may be connected to the third wiring W3 or the fourth wiring W4 to transfer the control signal to the embedded driving circuit portion 40.

The third wiring W3 may be arranged in the same layer as the gate electrode G1 and may be formed with the same material as the gate electrode G1 and at the same time as the gate electrode G1. The fourth wiring W4 may be arranged in the same layer as the bias electrode BSM and may be formed with the same material as the bias electrode BSM and at the same time as the bias electrode BSM. The fifth wiring W5 may be arranged in the same layer as the source electrode S1 or the drain electrode D1 and may be formed with the same material as the source electrode S1 or the drain electrode D1 and at the same time as the source electrode S1 or the drain electrode D.

The dam portion 120 may be arranged in the peripheral area PA farther from the display area DA than the planarization layer 118 and the pixel-defining layer 119, which extend from the display area DA. The dam portion 120 may include a first dam 121 and a second dam 123. The dam portion 120 may be spaced apart from the planarization layer 118 and the pixel-defining layer 119 and may prevent an organic material from flowing to the edge of the substrate 100 when the organic encapsulation layer 420 of the thin-film encapsulation layer 400 is formed. In embodiments where the dam portion 120 includes a plurality of dams, the plurality of dams may be spaced apart from each other. For example, the first dam 121 and the second dam 123 may be spaced apart from each other.

Each of the first dam 121 and the second dam 123 may have a single-layered or a multi-layered structure. As shown in the drawings, the first dam 121 may have a structure in which a first layer 121a, a second layer 121b, and a third layer 121c are stacked. The second dam 123 may have a structure in which a first layer 123a and a second layer 123b are stacked. Accordingly, the height of the first dam 121 may be higher than that of the second dam 123.

In this embodiment, the first layers 121a and 123a of the first dam and second dam, respectively, may be formed simultaneously with the planarization layer 118 and with the same material as the planarization layer. The second layers 121b and 123b of the first dam and second dam, respectively, may be formed simultaneously with the pixel-defining layer 119 and with the same material as the pixel-defining layer. The third layer 121c may be formed simultaneously with the spacer 119S and with the same material as the spacer 119S.

The first inorganic encapsulation layer 410 and the second inorganic encapsulation layer 430 of the thin-film encapsulation layer 400 may be in direct contact with the outside of the first dam 121. Therefore, the organic encapsulation layer 420 may not be exposed to the outside and the penetration of external air or moisture by the organic material may be prevented by the first inorganic encapsulation layer 410 and the second inorganic encapsulation layer 430.

The inorganic protective layer PVX may be in direct contact with the first inorganic encapsulation layer 410 in an area between the first dam 121 and the second dam 123 and an area outside the first dam 121. Since both the first inorganic encapsulation layer 410 and the inorganic protective layer PVX include an inorganic material, the adhesion may be enhanced. In addition, since an organic material is not between the first dam 121 and the support 130, the permeability of moisture from external air may be effectively blocked.

The dam portion 120 may at least partially overlap the embedded driving circuit portion 40 and/or the wiring portion 50. For example, both the first dam 121 and the second dam 123 may overlap the TFT T' of the embedded driving circuit portion 40. Alternatively, the first dam 121 may overlap the wiring portion 50 and the second dam 123 may overlap the embedded driving circuit portion 40. In addition, the dam portion 120 may not overlap the embedded driving circuit portion 40 but may overlap only the wiring portion 50, but various modifications thereof are possible.

As the dam portion 120 at least partially overlaps the embedded driving circuit portion 40 and/or the wiring portion 50, it is not necessary to secure a separate space for forming the dam portion 120, and thus, the size of the peripheral area PA may be reduced.

The support 130 may be arranged outside the dam portion 120. The support 130 may be a member for supporting a mask M used in a masking process as shown in FIG. 3B. A mask support 130M may be provided on one side of the mask M to support the mask M by being engaged with the support 130 of the display device. The support 130 may include an organic material and may be capable of buffering when supporting the mask. The support 130 may serve to suppress the transmission of cracks onto the display area DA in addition to the role of supporting the mask M.

The support 130 may protrude from the top surface of the substrate 100 and the support may be formed simultaneously with the planarization layer 118 and with the same material as the planarization layer 118. The height of the support 130 may be less than the height of the dam portion 120, e.g., the first dam 121 and the second dam 123. The support 130 may overlap at least a portion of the wiring portion 50. Accordingly, the size of the peripheral area PA may be reduced.

Figure 4:
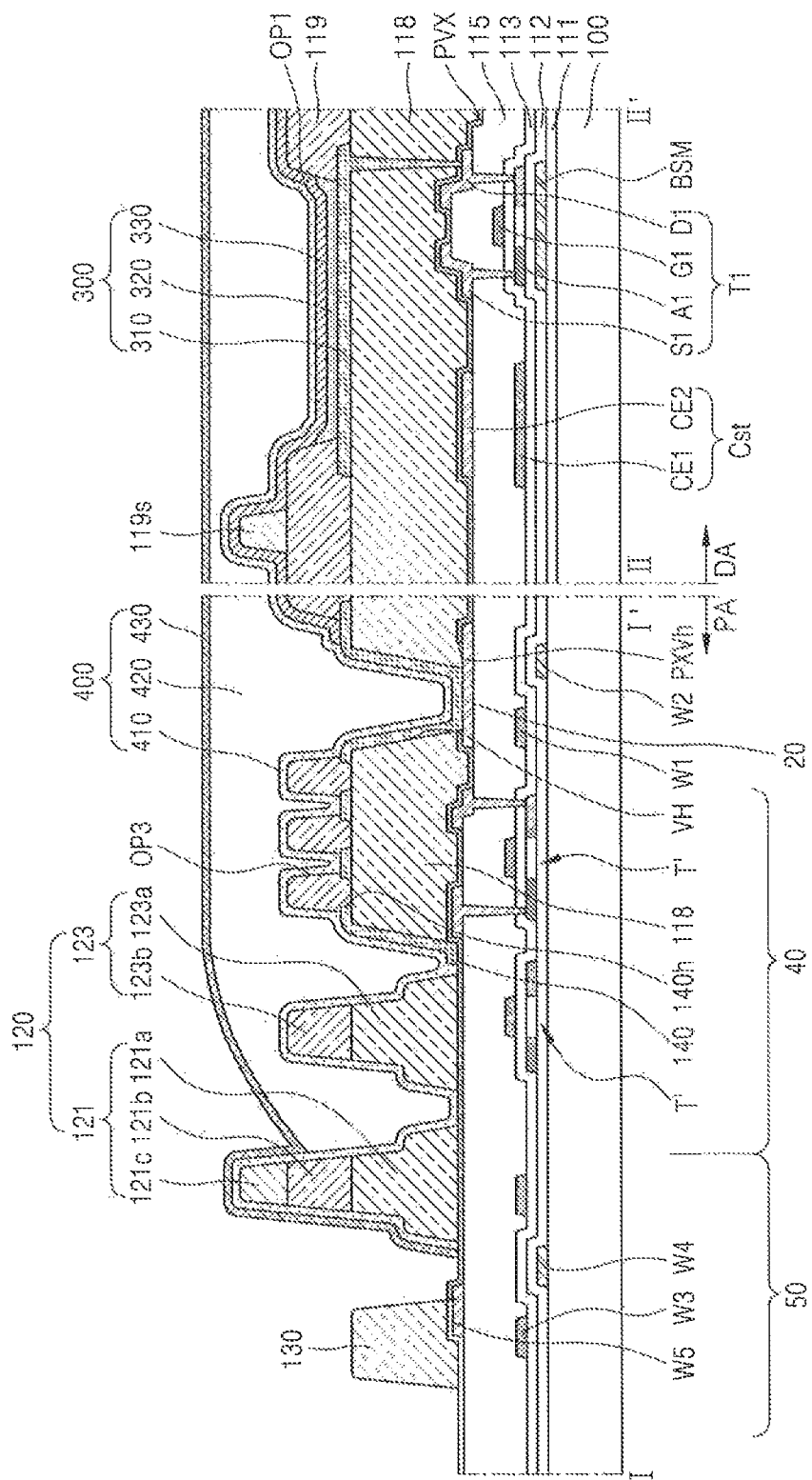
FIG. 4 is a cross-sectional view of a display device taken along lines I-I' and II-II' of FIG. 1 according to another exemplary embodiment of the present inventive concepts.

FIG. 4 is a cross-sectional view of a display device according to another exemplary embodiment. In FIG. 4, reference numerals that are the same as those in FIG. 3A denote members that are the same as those in FIG. 3A. Therefore, repeated descriptions will be omitted.

Referring to FIG. 4, the display device according to the present exemplary embodiment includes a display area DA and a peripheral area PA outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140, a dam portion 120, and a support 130 may be arranged in the peripheral area PA.

The display device according to the present exemplary embodiment further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In addition, in the display device according to the present exemplary embodiment, the second power supply line 20 may be arranged closer to the display area DA than the embedded driving circuit portion 40. The shielding layer 140 may at least partially overlap the embedded driving circuit portion 40. The dam portion 120 may overlap the embedded driving circuit portion 40 and/or the wiring portion 50.

The dam portion 120 may include a first dam 121 and a second dam 123, spaced apart from each other. Each of the first dam 121 and the second dam 123 may include a plurality of layers. For example, the first dam 121 may include a first layer 121*a* formed simultaneously with a planarization layer 118 and with the same material as the planarization layer 118, a second layer 121*b* formed simultaneously with a pixel-defining layer 119 and with the same material as the pixel-defining layer 119, and a third layer 121*c* formed simultaneously with a spacer 119S and with the same material as the spacer 119S. The second dam 123 may include a first layer 123*a* formed simultaneously with the planarization layer 118 and with the same material as the planarization layer 118 and a second layer 123*b* formed simultaneously with the pixel-defining layer 119 and with the same material as the pixel-defining layer 119.

In the exemplary embodiment shown in FIG. 4, the first layers 121*a* and 123*a* of the dam portion 120 are formed using a halftone mask process and a step or a curvature may be formed on the side surfaces thereof. For example, a step or curvature may be formed on a side surface of the first layer of the dam portion.

As a step or a curvature is formed on the first layers 121*a* and 123*a* of the dam portion 120, cracks and the like that may occur in members arranged on the dam portion 120 may be prevented.

In FIG. 4, a shielding layer 140 is shown as not overlapping the dam portion 120. However, exemplary embodiments of the present inventive concepts are not limited thereto. The shielding layer 140 may extend to the sides and upper portions of the first layers 121*a* and 123*a* of the dam portion 120.

In embodiments where the shielding layer 140 is arranged above the first layers 121*a* and 123*a* of the dam portion 120, the distance between the shielding layer 140 and the TFT T' of the embedded driving circuit portion 40 increases and thus a parasitic capacitance may be reduced.

Figure 5:
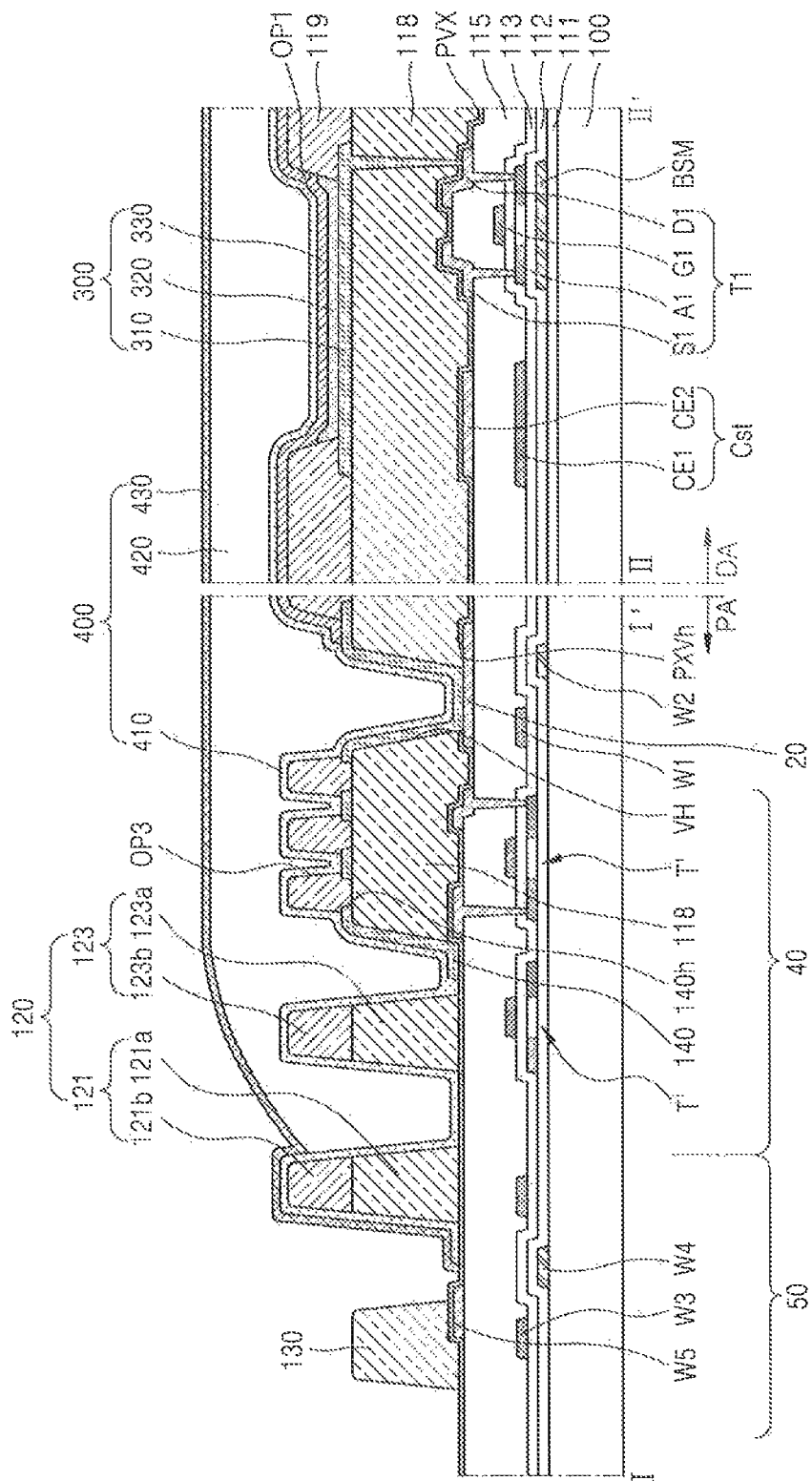
FIG. 5 is a cross-sectional view of a display device taken along lines I-I' and II-II' of FIG. 1 according to another exemplary embodiment of the present inventive concepts.

FIG. 5 is a cross-sectional view of a display device according to another exemplary embodiment. In FIG. 5, reference numerals that are the same as those in FIG. 3A denote members that are the same as those in FIG. 3A. Therefore, repeated descriptions will be omitted.

Referring to FIG. 5, the display device according to the exemplary embodiment may include a display area DA and a peripheral area PA outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140, a dam portion 120, and a support 130 may be arranged in the peripheral area PA.

The display device according to the exemplary embodiment further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In addition, in the display device according to the exemplary embodiment, the second power supply line 20 may be arranged closer to the display area DA than the embedded driving circuit portion 40. The shielding layer 140 may at least partially overlap the embedded driving circuit portion 40. The dam portion 120 may overlap the embedded driving circuit portion 40 and/or the wiring portion 50.

The dam portion 120 may include a first dam 121 and a second dam 123, spaced apart from each other. In the exemplary embodiment shown in FIG. 5, the height of the first dam 121 may be equal to that of the second dam 123. In addition, the spacer 119S in FIG. 3A may not be included in the display area DA.

Each of the first dam 121 and the second dam 123 may include a plurality of layers. For example, the first dam 121 may include a first layer 121*a* formed simultaneously with a planarization layer 118 and with the same material as the planarization layer 118 and a second layer 121*b* formed simultaneously with a pixel-defining layer 119 and with the same material as the pixel-defining layer 119. The second dam 123 may include a first layer 123*a* formed simultaneously with the planarization layer 118 and with the same material as the planarization layer 118 and a second layer 123*b* formed simultaneously with the pixel-defining layer 119 and with the same material as the pixel-defining layer 119.

In an exemplary embodiment, the first layers 121*a* and 123*a* of the dam portion 120 are formed using a halftone mask process and thus a step or a curvature may be formed on the side surfaces thereof. For example, a step or curvature may be formed on the side surfaces of the first layer 121*a* of the dam portion.

Figure 6:
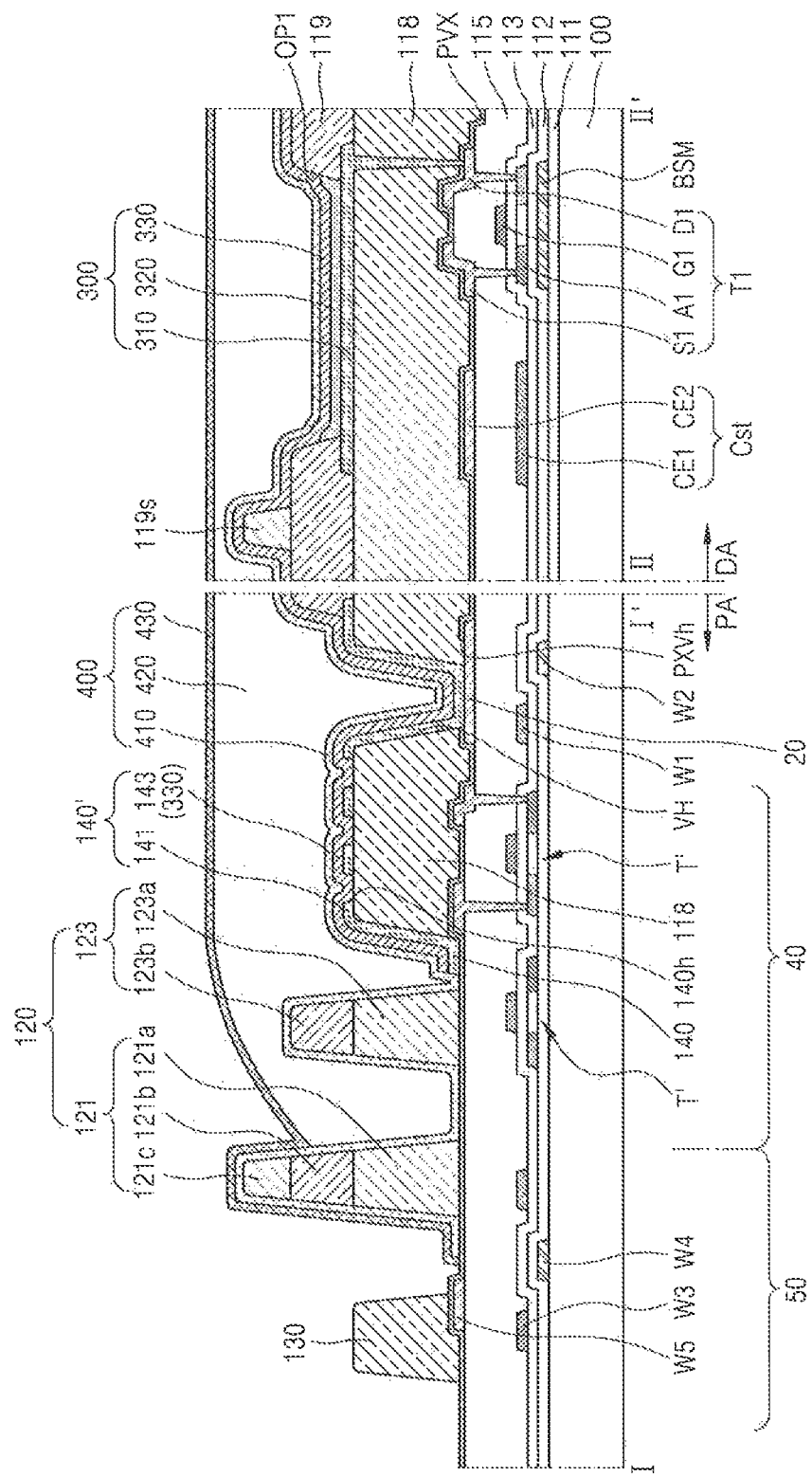
FIG. 6 is a cross-sectional view of a display device taken along lines I-I' and II-II' of FIG. 1 according to another exemplary embodiment of the present inventive concepts.

FIG. 6 is a cross-sectional view of a display device according to another exemplary embodiment. In FIG. 6, reference numerals that are the same as those in FIG. 3A denote members that are the same as those in FIG. 3A. Therefore, repeated descriptions will be omitted.

Referring to FIG. 6, the display device according to the present exemplary embodiment includes a display area DA and a peripheral area PA outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140', a dam portion 120, and a support 130 may be arranged in the peripheral area PA.

The display device according to the exemplary embodiment shown in FIG. 6 further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In addition, in the display device according to the exemplary embodiment shown in FIG. 6, the second power supply line 20 may be arranged closer to the display area DA than the embedded driving circuit portion 40. The shielding layer 140' may at least partially overlap the embedded driving circuit portion 40. The dam portion 120 may overlap the embedded driving circuit portion 40 and/or the wiring portion 50.

In the exemplary embodiment shown in FIG. 6, at least a portion of a TFT T' of the embedded driving circuit portion 40 may be covered with a planarization layer 118, and the shielding layer 140' arranged on the planarization layer and overlapping the embedded driving circuit portion 40 may include a plurality of layers.

For example, the shielding layer 140' may include a first shielding layer 141 including the same material as a pixel electrode 310, and a second shielding layer 143 extending from an opposite electrode 330. As the shielding layer 140' includes a plurality of layers, the embedded driving circuit portion 40 may be more stably protected.

The first shielding layer 141 may include a plurality of through holes 140*h*. Outgassing that may occur in the planarization layer 118 during the manufacturing process of the display device may be easily discharged through the plurality of through holes 140*h*.

The second shielding layer 143 may extend from the opposite electrode 330 and be arranged on the first shielding layer 141. In some exemplary embodiments, a plurality of through holes may also be formed in the second shielding layer 143. As shown in the exemplary embodiment of FIG. 6, an insulating layer formed in the same layer as a pixel-defining layer 119 may be arranged between the first shielding layer 141 and the second shielding layer 143. However, various modifications thereof are possible.

In FIG. 6, the shielding layer 140' is shown to terminate at a portion overlapping with the embedded driving circuit portion 40. However, exemplary embodiments are not limited thereto. For example, the shielding layer 140' may extend to the outside of the dam portion 120. In an exemplary embodiment, only one of the first shielding layer 141 and the second shielding layer 143 of the shielding layer 140' may extend to the outside of the first dam 121 or the second dam 123.

Figure 7:
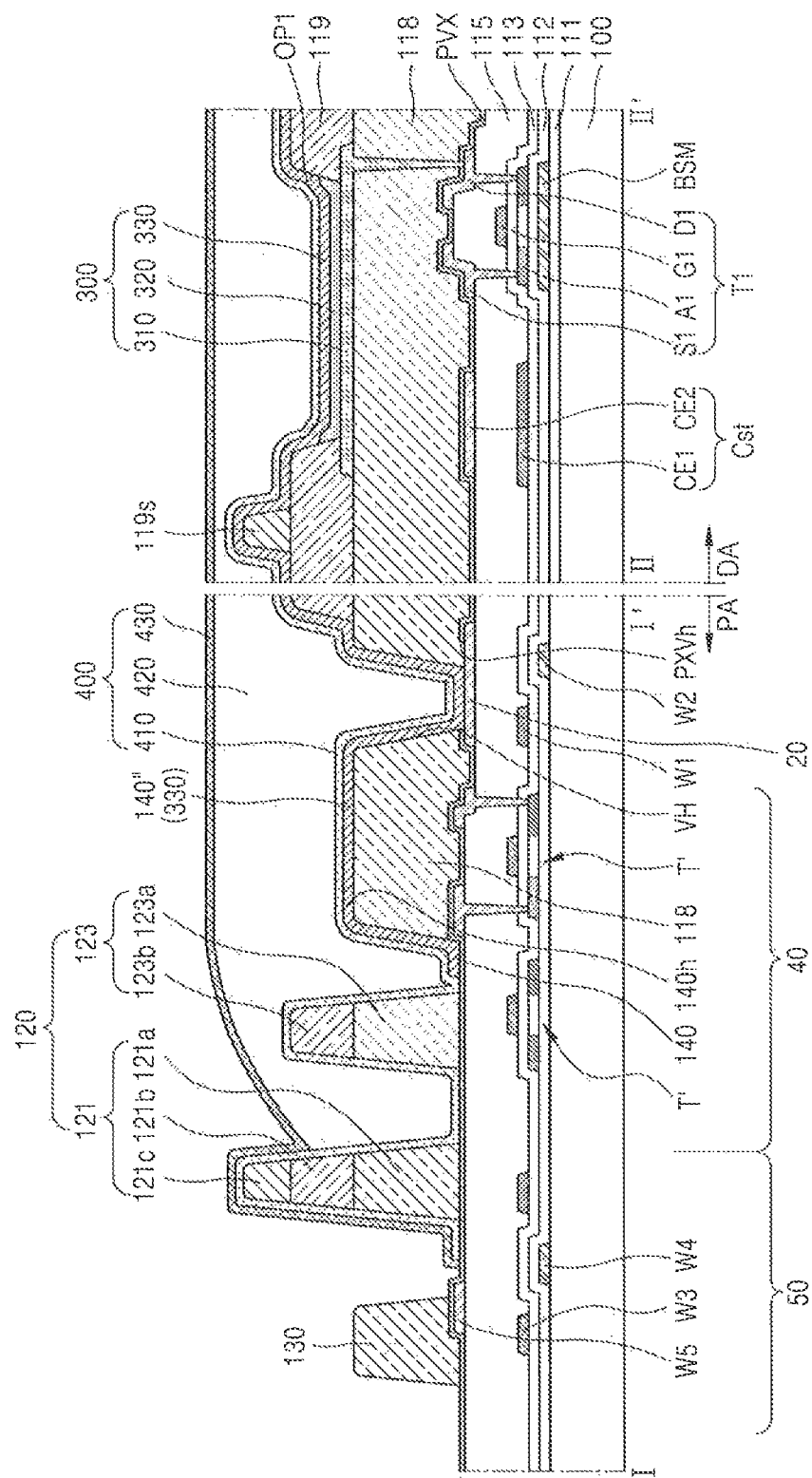
FIG. 7 is a cross-sectional view of a display device taken along lines I-I' and II-II' of FIG. 1 according to another exemplary embodiment of the present inventive concepts.

FIG. 7 is a cross-sectional view of a display device according to another exemplary embodiment. In FIG. 7, reference numerals that are the same as those in FIG. 3A denote members that are the same as those in FIG. 3A. Therefore, repeated descriptions will be omitted.

Referring to FIG. 7, the display device according to the present exemplary embodiment includes a display area DA and a peripheral area PA disposed outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140", a dam portion 120, and a support 130 may be arranged in the peripheral area PA.

The display device according to the exemplary embodiment shown in FIG. 5 further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In addition, in the display device according to the exemplary embodiment shown in FIG. 5, the second power supply line 20 may be arranged closer to the display area DA than the embedded driving circuit portion 40. The shielding layer 140" may at least partially overlap the embedded driving circuit portion 40. The dam portion 120 may overlap the embedded driving circuit portion 40 and/or the wiring portion 50.

In the exemplary embodiment shown in FIG. 7, at least a portion of a TFT T' of the embedded driving circuit portion 40 may be covered with a planarization layer 118, and the shielding layer 140" may be arranged on the planarization layer 118 and at least partially overlap the embedded driving circuit portion 40.

In the exemplary embodiment shown in FIG. 7, the shielding layer 140" may be integrated with an opposite electrode 330. The shielding layer 140" may extend from the opposite electrode 330 of the display area DA and may at least partially overlap the embedded driving circuit portion 40 of the peripheral area PA.

While the embodiment shown in FIG. 7 does not include the shielding layer 140" having a plurality of through holes, in exemplary embodiments, the shielding layer 140" may include a plurality of through holes. Therefore, outgassing that may occur in the planarization layer 118 may be easily discharged.

In FIG. 7, the shielding layer 140" is shown to correspond to a portion of the embedded driving circuit portion 40. However, exemplary embodiments of the present inventive concepts are not limited thereto. For example, the shielding layer 140" may extend to the outside of the dam portion 120.

Figure 8A:
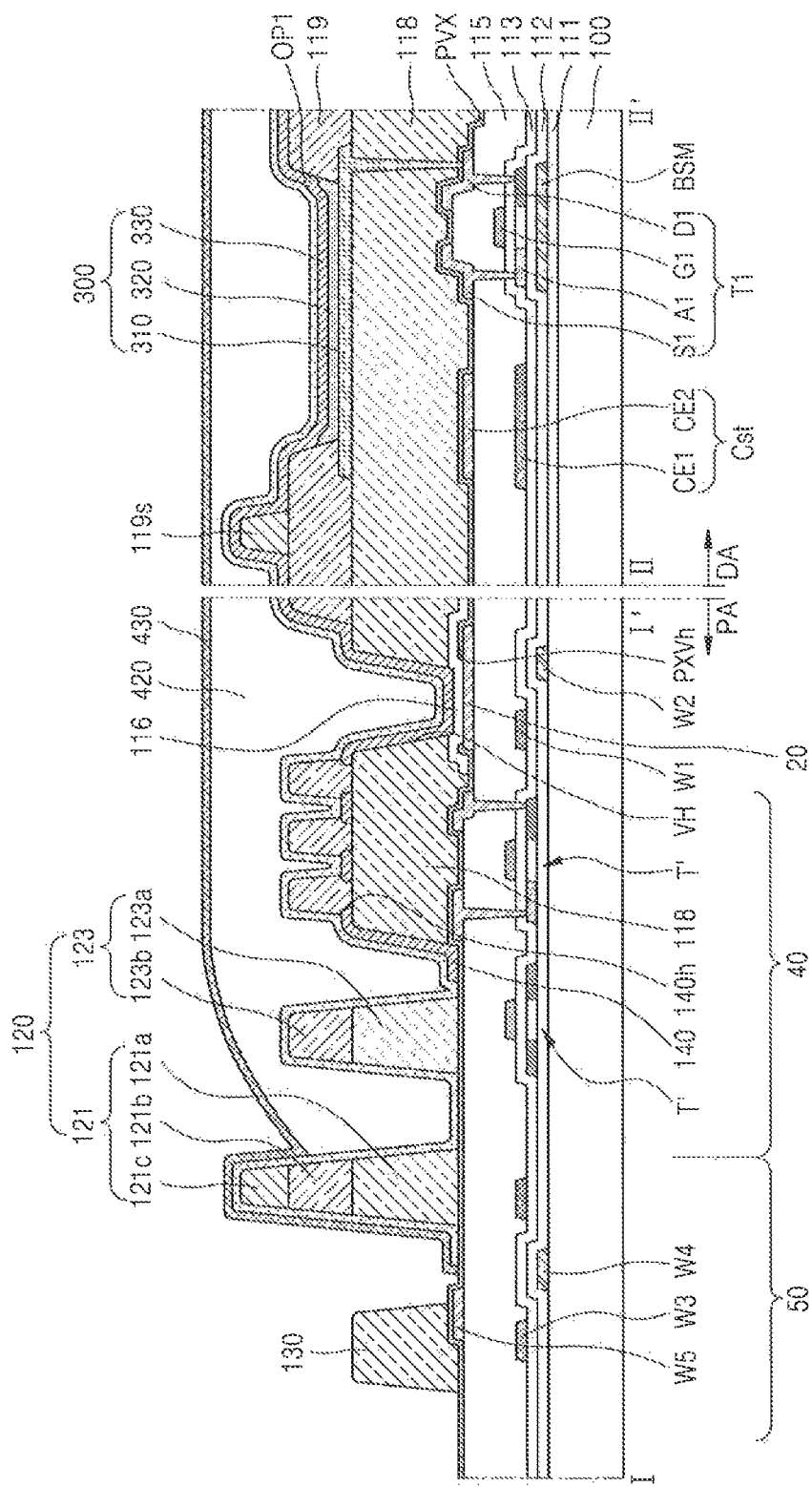
FIG. 8A is a cross-sectional view of a display device taken along lines I-r and IH-If of FIG. 1 according to another exemplary embodiment of the present inventive concepts.

FIG. 8A is a cross-sectional view of a display device according to another exemplary embodiment of the present inventive concepts. In FIG. 8A, reference numerals that are the same as those in FIG. 3A denote members that are the same as those in FIG. 3A. Therefore, repeated descriptions will be omitted.

Referring to FIG. 8A, the display device according to the exemplary embodiment includes a display area DA and a peripheral area PA outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140, a dam portion 120, and a support 130 may be arranged in the peripheral area PA.

The display device according to the exemplary embodiment shown in FIG. 8A further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In addition, in the display device according to the present exemplary embodiment, the second power supply line 20 may be arranged closer to the display area DA than the embedded driving circuit portion 40. The shielding layer 140' may at least partially overlap the embedded driving circuit portion 40. The dam portion 120 may overlap the embedded driving circuit portion 40 and/or the wiring portion 50.

In the exemplary embodiment shown in FIG. 8A, a conductive protective layer 116 for protecting the second power supply line may be further arranged on the second power supply line 20 exposed by the inorganic protective layer PVX. The inorganic protective layer PVX may include a hole PVXh corresponding to the second power supply line 20, and the conductive protective layer 116 may be arranged to correspond to the hole PVXh.

Since the second power supply line 20 has to be electrically connected to an opposite electrode 330 in a subsequent process, the second power supply line 20 may be exposed by partially removing the inorganic protective layer PVX. In this embodiment, the second power supply line 20 may be damaged by an etchant used in the subsequent process.

The conductive protective layer 116 may be a layer formed to protect the second power supply line 20 from such damage. In addition, the conductive protective layer 116 may have conductivity and may electrically connect the second power supply line 20 to the opposite electrode 330.

In the present exemplary embodiment, the conductive protective layer 116, the shielding layer 140, and the opposite electrode 330 are sequentially in contact with each other and thus the common voltage ELVSS provided by the second power supply line 20 may be transmitted to the opposite electrode 330.

The conductive protective layer 116 may include at least one of ITO, IZO, ZnO, In$_2$O$_3$, IGO, and AZO.

Figure 8B:
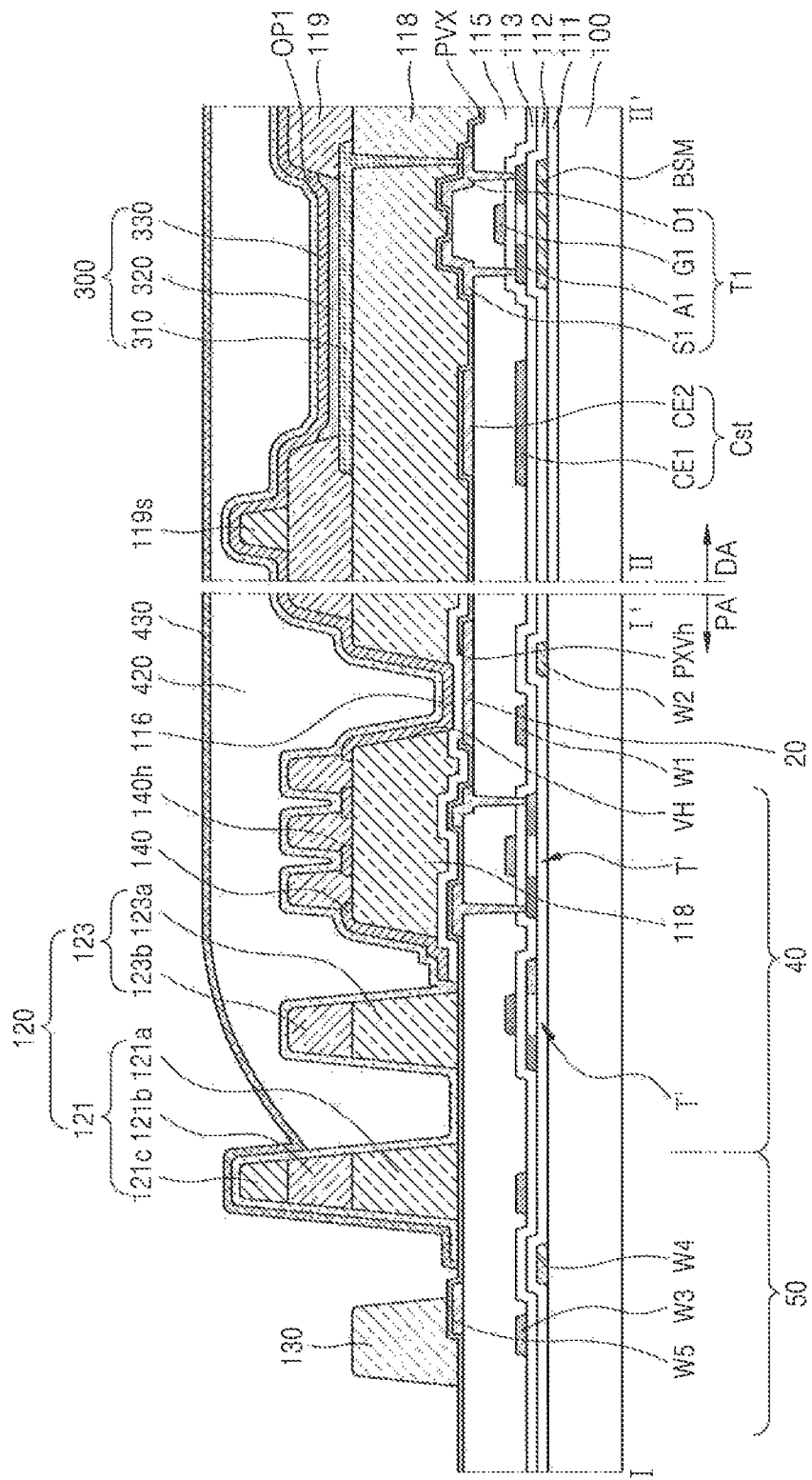
FIG. 8B is a cross-sectional view of a display device taken along lines I-I' and II-II' of FIG. 1 according to another exemplary embodiment of the present inventive concepts.

FIG. 8B is a cross-sectional view of a display device according to another exemplary embodiment. In FIG. 8B, reference numerals that are the same as those in FIG. 8A denote members that are the same as those in FIG. 8A. Therefore, repeated descriptions will be omitted.

Referring to FIG. 8B, the display device according to the exemplary embodiment shown in FIG. 8B includes a display area DA and a peripheral area PA outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140, a dam portion 120, and a support 130 may be arranged in the peripheral area PA.

The display device according to the exemplary embodiment shown in FIG. 8B further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In the exemplary embodiment shown in FIG. 8B, a conductive protective layer 116 may extend to overlap the embedded driving circuit portion 40 and/or the wiring portion 50 with the inorganic protection layer PVX therebetween. In this embodiment, the conductive protective layer 116 may serve as a shielding layer for protecting the embedded driving circuit portion 40 from static electricity.

As with the conductive protective layer 116, conductive layers which are insulated by a TFT and an insulating layer in the embedded driving circuit portion 40 and overlap each other may all serve as shielding layers.

In FIG. 8B, the conductive protective layer 116 is connected to the second power supply line 20 and may extend to the embedded driving circuit portion 40. However, exemplary embodiments of the present inventive concepts are not limited thereto. The conductive protective layer 116 may be arranged in a manner such that a portion arranged above the embedded driving circuit portion 40 and a portion arranged above the second power supply line 20 may be spaced apart from each other.

Furthermore, the conductive protective layer 116 may extend to overlap the wiring portion 50. Referring to FIG. 1, the conductive protective layer 116 may be arranged on any of the upper, lower, left, and right sides of the display area DA. In FIG. 8B, the conductive protective layer 116 is shown as not overlapping the dam portion 120. However, the exemplary embodiments of the present inventive concepts are not limited thereto. The conductive protective layer 116 may extend to the side and upper portion of the first dam 121 or the second dam 123, and may be modified in various ways.

Figure 9:
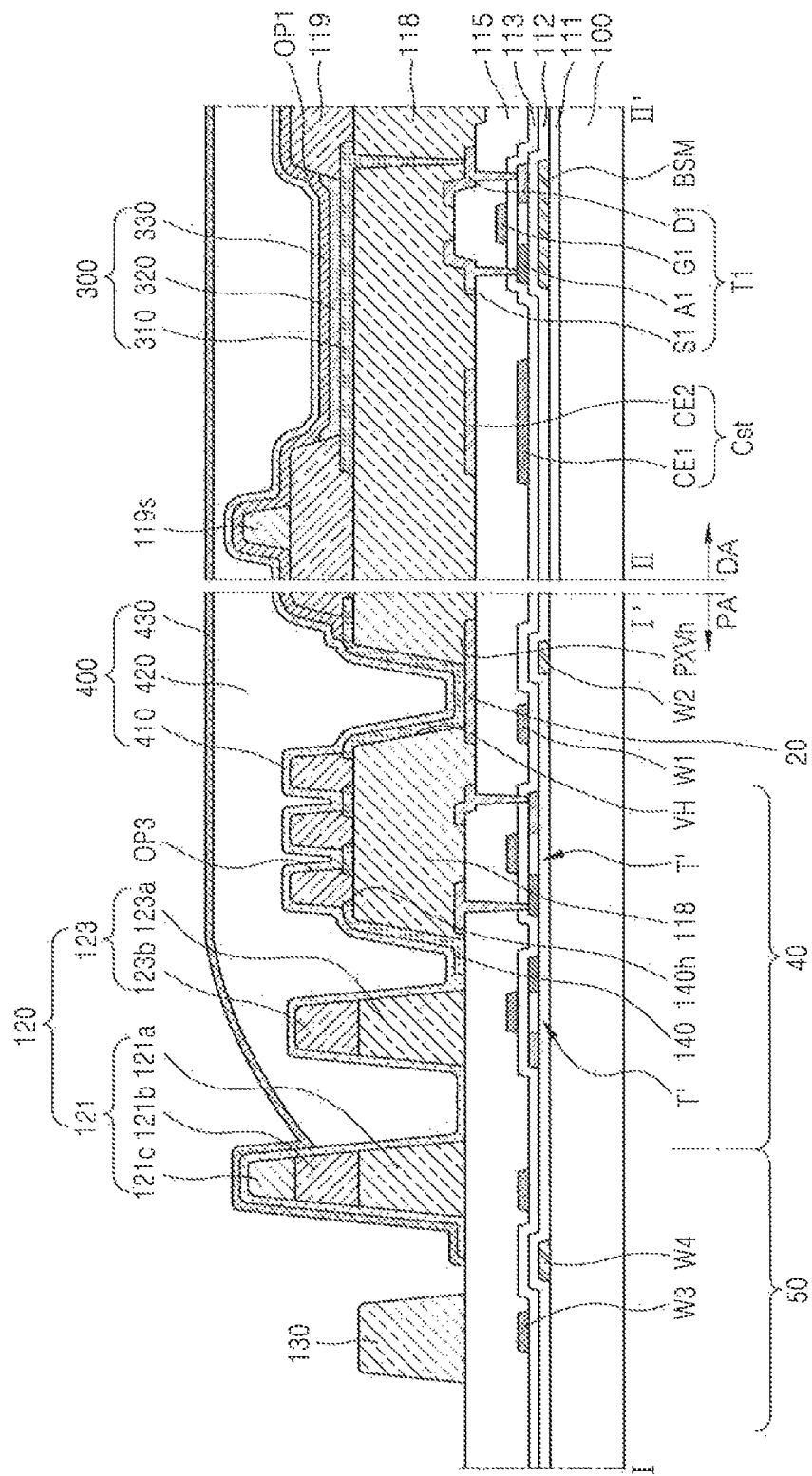
FIG. 9 is a cross-sectional view of a display device taken along lines I-I' and II-II' of FIG. 1 according to another exemplary embodiment of the present inventive concepts.

FIG. 9 is a cross-sectional view of a display device according to another exemplary embodiment. In FIG. 9, reference numerals that are the same as those in FIG. 3A denote members that are the same as those in FIG. 3A. Therefore, repeated descriptions will be omitted.

Referring to FIG. 9, the display device according to the present exemplary embodiment includes a display area DA and a peripheral area PA outside the display area DA. At least one TFT, such as a driving TFT T1, and a display element connected to the at least one TFT may be arranged on the display area DA. A second power supply line 20, which may be a common voltage supply line, an embedded driving circuit portion 40, a wiring portion 50, a shielding layer 140, a dam portion 120, and a support 130 may be arranged in the peripheral area PA.

In the display device according to the present exemplary embodiment, the second power supply line 20 may be arranged closer to the display area DA than the embedded driving circuit portion 40. The shielding layer 140' may at least partially overlap the embedded driving circuit portion 40. The dam portion 120 may overlap the embedded driving circuit portion 40 and/or the wiring portion 50.

The display device according to the present exemplary embodiment may not include the inorganic protective layer PVX (see FIG. 3A). As described above, the inorganic protective layer PVX is provided to protect wirings formed in the same layer as the source electrodes S1 and the drain electrodes D1 of the TFTs T1 and T'. Therefore, when there is no risk of exposure of the wirings formed in the same layer as the source electrodes S1 and the drain electrodes D1, the inorganic protective layer PVX may not be arranged.

For example, when wirings arranged in the peripheral area PA are used as a first wiring W1 and a third wiring W3, arranged in the same layer is used as a gate electrode G1, or as a second wiring W2 and a fourth wiring W4, are arranged in the same layer as a bias electrode BSM, the inorganic protective layer PVX may not be formed.

Figure 10:
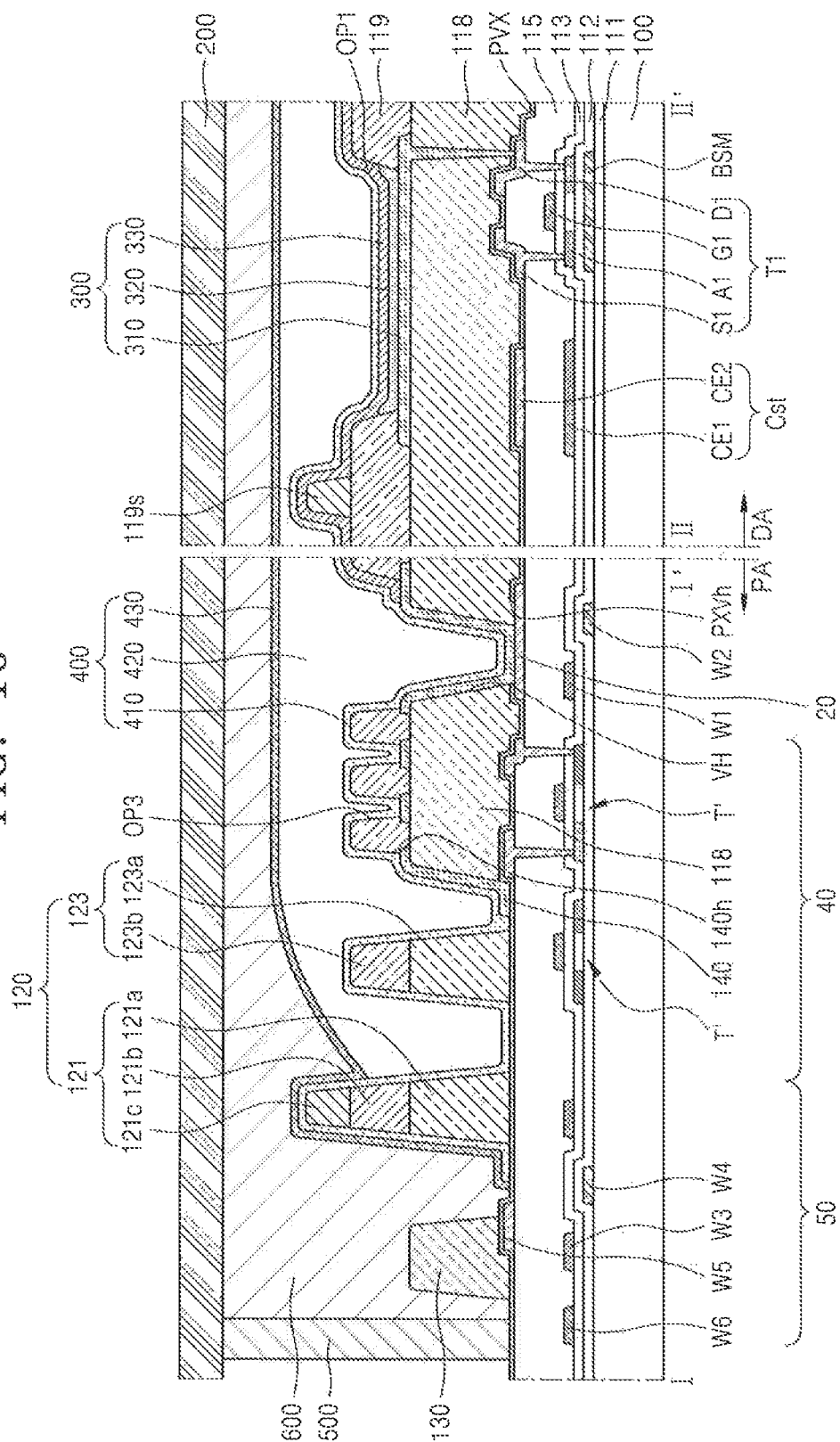
FIG. 10 is a cross-sectional view of a display device taken along lines I-I' and II-II' of FIG. 1 according to another exemplary embodiment of the present inventive concepts.

FIG. 10 is a cross-sectional view of a display device according to another exemplary embodiment. In FIG. 10, reference numerals that are the same as those in FIG. 3A denote members that are the same as those in FIG. 3A. Therefore, repeated descriptions will be omitted.

Referring to FIG. 10, the display device according to the present exemplary embodiment includes a display area DA and a peripheral area PA outside the display area DA. At least one TFT, such as a driving TFT T1, and a display element connected to the at least one TFT may be arranged on the display area DA. A second power supply line 20, which is a common voltage supply line, an embedded driving circuit portion 40, a wiring portion 50, a shielding layer 140, a dam portion 120, and a support 130 may be arranged in the peripheral area PA.

In the display device according to the exemplary embodiment shown in FIG. 10, the second power supply line 20 may be arranged closer to the display area DA than the embedded driving circuit portion 40. The shielding layer 140' may at least partially overlap the embedded driving circuit portion 40. The dam portion 120 may overlap the embedded driving circuit portion 40 and/or the wiring portion 50.

In the present exemplary embodiment, the display device may further include an upper substrate 200. In an exemplary embodiment, the upper substrate 200 may include at least one of a color filter glass, a polarizer, and a window. When the upper substrate 200 includes the color filter glass, the upper substrate 200 may be a Quantum dots color filter.

A substrate 100 and the upper substrate 200 may be bonded together by a sealing member 500. The sealing member 500 may surround the outer periphery of the peripheral area PA in the outside of the support 130. The sealing member 500 may include a sealant, a frit, or the like.

A filler 600 may be further arranged between the substrate 100 and the upper substrate 200. The filler 600 may buffer an external pressure or the like. The filler 600 may include an organic material such as polyimide.

Figure 11:
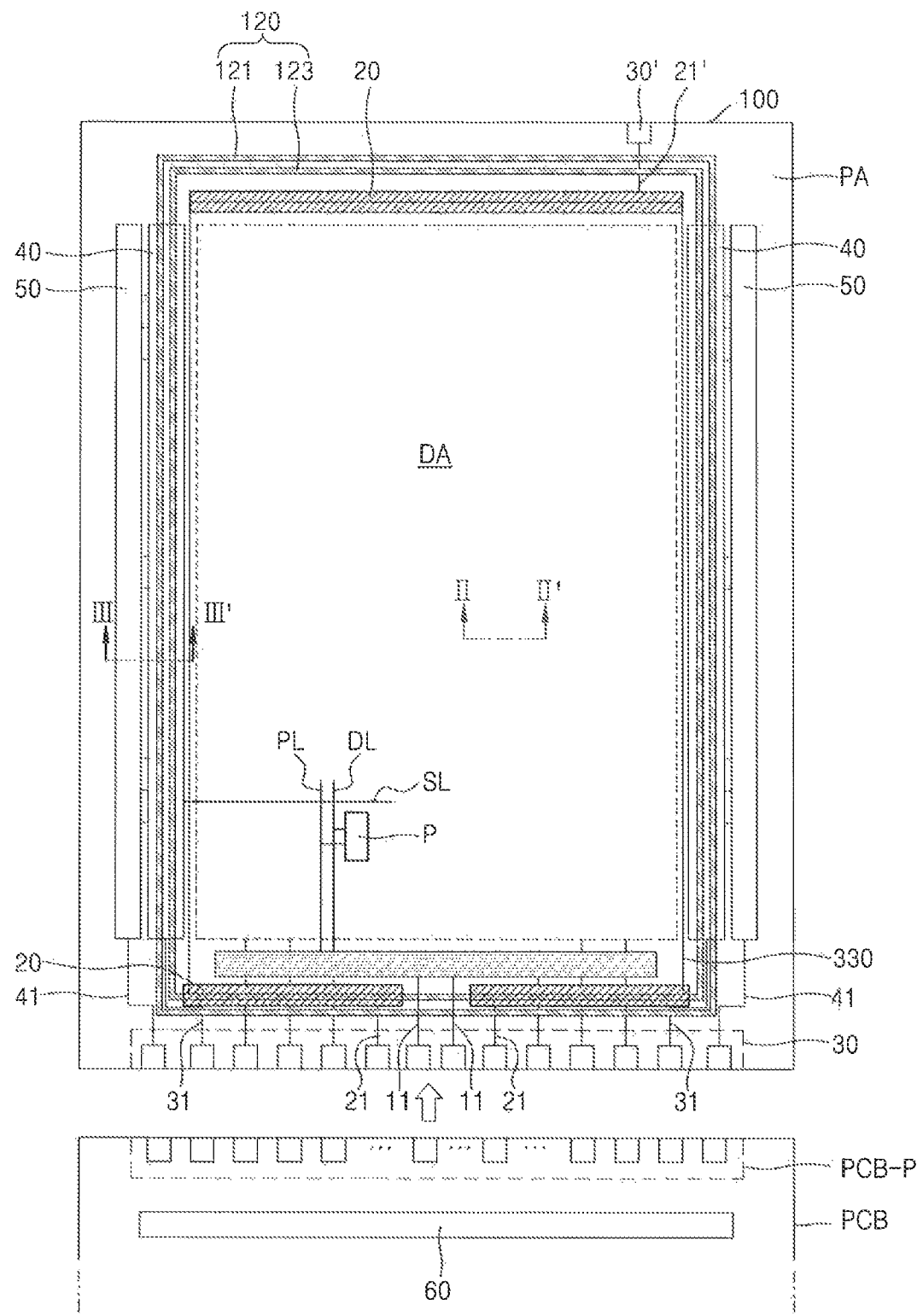
FIG. 11 is a plan view of a display device according to another exemplary embodiment of the present inventive concepts.
Figure 12:
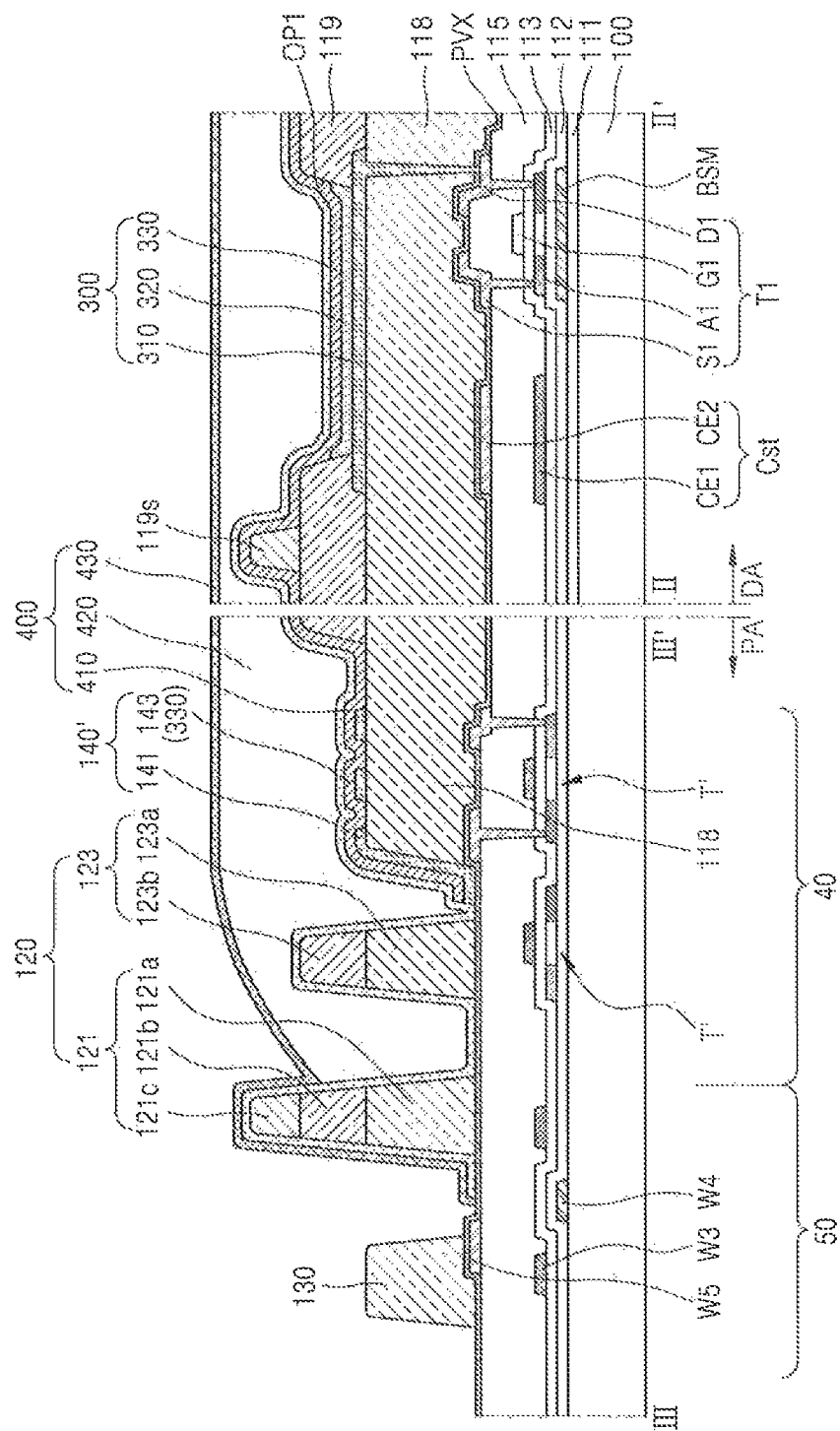
FIG. 12 is a cross-sectional view taken along lines II-II' and line III-III' of FIG. 11 according to an exemplary embodiment of the present inventive concepts.

FIG. 11 is a plan view of a display device according to another exemplary embodiment, and FIG. 12 is a cross-sectional view taken along line II-II' and line III-III' of FIG. 11. In FIG. 11, reference numerals that are the same as those in FIG. 1 denote members that are the same as those in FIG. 1. In FIG. 12, reference numerals that are the same as those in FIG. 6 denote members that are the same as those in FIG. 6.

Referring to FIG. 11, a second power supply line 20 may be arranged on the upper side and the lower side of a display area DA, or may be arranged only on the upper side or the lower side. Since the second power supply line 20 may not be included on the left and right sides of the display area DA, the peripheral area PA may be reduced.

In the exemplary embodiment shown in FIG. 11, the second power supply line 20 may be arranged in the same layer as the source electrodes or the drain electrodes of TFTs T1, T, and T' and may not be arranged between an embedded driving circuit portion 40 and the display area DA.

The second power supply line 20 arranged on the lower side of the display area DA may be connected to a terminal portion 30, arranged on the lower side of the second power supply line 20, via a second connection line 21. The terminal portion 30 may be exposed without being covered by an insulating layer and may be electrically connected to a printed circuit board PCB. The printed circuit board PCB connected to the terminal portion 30 may provide a common voltage ELVSS to the second power supply line 20 via the second connection line 21.

The second power supply line 20 positioned on the upper side of the display area DA may be connected to an additional terminal 30' that is positioned on the upper side of the second power supply line 20, via an additional connection line 21'. The additional terminal 30' may be exposed without being covered by an insulating layer and may be connected to an additional printed circuit board or a driver integrated circuit (IC). An additional printed circuit board or driver IC connected to the additional terminal 30' may provide a common voltage ELVSS to the second power supply line 20. Although the second power supply line 20 is shown in FIG. 11 as being arranged on the upper side and the lower side of the display area DA, exemplary embodiments of the present inventive concepts are not limited thereto. For example, the second power supply line 20 may be arranged only on the lower side of the display area DA.

An opposite electrode 330 may correspond to the entire display area DA and may at least partially overlap and be electrically connected to the second power supply line 20 arranged on the upper side and the lower side of the display area DA. For example, the opposite electrode 330 may be directly connected to the second power supply line 20, or may be electrically connected to the second power supply line 20 through another conductive layer between the opposite electrode 330 and the second power supply line 20.

The opposite electrode 330 on the left and right sides of the display area DA may be in contact with a first shielding layer 141 (see FIG. 12) arranged in the same layer as a pixel electrode 310 (see FIG. 12). Accordingly, the opposite electrode 330 may be in four-sided contact with the other conductive layers on the upper, lower, left, and right sides of the display area DA.

In an exemplary embodiment, the first shielding layer 141 may be electrically connected to the second power supply line 20 in the upper side and/or the lower side of the display area DA. Accordingly, the first shielding layer 141 may serve to transmit the common voltage ELVSS to the opposite electrode 330.

Referring to FIG. 12, the display device according to the exemplary embodiment shown in FIG. 12 includes a display area DA and a peripheral area PA outside the display area DA. At least one TFT, such as a driving TFT T1, and a display element connected to the at least one TFT may be arranged on the display area DA. An embedded driving circuit portion 40, a wiring portion 50, a shielding layer 140', a dam portion 120, and a support 130 may be arranged in the peripheral area PA.

The display device according to the exemplary embodiment further includes a thin-film encapsulation layer 400 sealing the display area DA and a portion of the peripheral area PA, and a first inorganic encapsulation layer 410 and/or a second inorganic encapsulation layer 430 of the thin-film encapsulation layer 400 may be in contact with an inorganic protective layer PVX.

In addition, in the display device according to the exemplary embodiment shown in FIG. 12, the shielding layer 140' may at least partially overlap the embedded driving circuit portion 40. The dam portion 120 may overlap the embedded driving circuit portion 40 and/or the wiring portion 50.

In the present exemplary embodiment, at least a portion of a TFT T' of the embedded driving circuit portion 40 may be covered with a planarization layer 118, and the shielding layer 140' arranged on the planarization layer 118 and overlapping the embedded driving circuit portion 40 may include a plurality of layers.

For example, the shielding layer 140' may include a first shielding layer 141 including the same material as a pixel electrode 310, and a second shielding layer 143 extending from an opposite electrode 330. As the shielding layer 140' includes a plurality of layers, the embedded driving circuit portion 40 may be more stably protected.

The first shielding layer 141 may include a plurality of through holes. Outgassing that may occur in the planarization layer 118 during the manufacturing process of the display device may be easily discharged through the plurality of through holes.

The second shielding layer 143 may extend from the opposite electrode 330 and be arranged on the first shielding layer 141. Although not shown in FIG. 12, a plurality of through holes may also be formed in the second shielding layer 143. In addition, an insulating layer formed in the same layer as a pixel-defining layer 119 may be arranged between the first shielding layer 141 and the second shielding layer 143, but various modifications thereof are possible.

In the exemplary embodiment shown in FIG. 12, the first shielding layer 141 and the second shielding layer 143 may be in contact with each other and an end of the second shielding layer 143 may be arranged between the wiring portion 50 and the display area DA. For example, the second shielding layer 143 may be arranged to overlap the embedded driving circuit portion 40 and not to overlap wirings W3, W4, and W5 transmitting a driving signal to the embedded driving circuit portion 40.

In FIG. 12, the shielding layer 140' is shown to terminate at a portion of the embedded driving circuit portion 40, but exemplary embodiments are not limited thereto. For example, the shielding layer 140' may extend to the outside of the dam portion 120. In an exemplary embodiment, only one of the first shielding layer 141 and the second shielding layer 143 of the shielding layer 140' may extend to the outside of the first dam 121 or the second dam 123.

In the present exemplary embodiment, a second power supply line 20 (see FIG. 3A) may not be arranged between the embedded driving circuit portion 40 of the peripheral area PA and the display area DA. As a result, the size of the peripheral area PA may be reduced. The first shielding layer 141 of the shielding layer 140' may serve to transfer a common voltage ELVSS in an area where the second power supply line 20 is not partially arranged.

In this embodiment, a point at which the first shielding layer 141 contacts the opposite electrode 330 may be formed between the wiring portion 50 and the display area DA. Alternatively, a point at which the first shielding layer 141 contacts the opposite electrode 330 may be formed between the dam portion 120 and the display area DA.

Exemplary embodiments applicable to the present inventive concepts have been described. Such exemplary embodiments may be implemented as separate embodiments or may be implemented as combined embodiments. For example, in the exemplary embodiment described with reference to FIG. 12, any one of the first shielding layer 141 and the second shielding layer 143 may not be arranged. In the exemplary embodiment described with reference to FIG. 12, the conductive protective layer 116 described with reference to FIG. 8B or the upper substrate 200 described with reference to FIG. 10 may be applied.

As described above, in the exemplary embodiments of the present disclosure, as the arrangement of members in a peripheral area is optimized, the size of the peripheral area may be reduced. In addition, since a shielding layer is introduced, high quality may be realized.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a display area configured for displaying an image and a peripheral area outside the display area;
   a first thin film transistor disposed on the display area;
   a display element electrically connected to the first thin film transistor, the display element comprising a pixel electrode, an intermediate layer, and an opposite electrode;
   an embedded driving circuit portion disposed on the peripheral area, the embedded driving circuit portion comprising a second thin film transistor;
   a wiring portion disposed at one side of the embedded driving circuit portion, the wiring portion having wirings connected to the embedded driving circuit portion;
   a thin-film encapsulation layer covering the display area, the thin-film encapsulation layer comprising at least one inorganic encapsulation layer and at least one organic encapsulation layer;
   a dam portion disposed in the peripheral area, the dam portion protruding from the substrate; and
   a protruding support disposed in the peripheral area farther from the display area than the dam portion, the protruding support being lower in height than the dam portion,
   wherein the at least one inorganic encapsulation layer is disposed between the dam portion and the protruding support.

2. The display device of claim 1, further comprising:
   a first shielding layer at least partially overlapping the second thin film transistor with a planarization layer disposed between the first shielding layer and the second thin film transistor, the first shielding layer comprising a same material as a material of the pixel electrode; and
   a second shielding layer disposed on the first shielding layer, the second shielding layer extending from the opposite electrode,
   wherein an end of the second shielding layer is disposed between the wiring portion and the display area.

3. The display device of claim 1, further comprising:
   an inorganic protective layer covering a source electrode or a drain electrode of the first thin film transistor and extending to the peripheral area.

4. The display device of claim 3, wherein the inorganic protective layer overlaps the wiring portion in the peripheral area.

5. The display device of claim 3, wherein the inorganic protective layer is disposed between the substrate and the protruding support in the peripheral area.

6. The display device of claim 3, wherein, in the peripheral area, the at least one inorganic encapsulation layer is in contact with the inorganic protective layer.

7. The display device of claim 1, further comprising:
a planarization layer covering at least a portion of the embedded driving circuit portion; and
a shielding layer disposed on the planarization layer, the shielding layer at least partially overlapping the embedded driving circuit portion.

8. The display device of claim 6, wherein the shielding layer comprises a same material as the pixel electrode and includes a plurality of through holes.

9. The display device of claim 1, wherein the dam portion at least partially overlaps the embedded driving circuit portion.

10. The display device of claim 1, wherein the dam portion comprises a first dam and a second dam that are spaced apart from each other.

11. The display device of claim 1, wherein at least one of the dam portion and the protruding support at least partially overlaps the wiring portion.

12. The display device of claim 1, further comprising:
a common voltage supply line disposed on the peripheral area, the common voltage supply line being positioned closer to the display area than the embedded driving circuit portion,
wherein the common voltage supply line is electrically connected to the opposite electrode.

13. The display device of claim 1, further comprising:
a sealing member disposed in the peripheral area farther from the display area than the protruding support; and
an upper substrate facing the substrate,
wherein the substrate and the upper substrate are adhered together by the sealing member.

* * * * *